(12) United States Patent
Behm et al.

(10) Patent No.: US 7,925,489 B2
(45) Date of Patent: Apr. 12, 2011

(54) DEFINING AND RECORDING THRESHOLD-QUALIFIED COUNT EVENTS OF A SIMULATION BY TESTCASES

(75) Inventors: Michael L. Behm, Cedar Park, TX (US); Carol I. Gabele, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 11/930,808

(22) Filed: Oct. 31, 2007

(65) Prior Publication Data

US 2009/0112561 A1 Apr. 30, 2009

(51) Int. Cl.
*G06F 17/50* (2006.01)
(52) U.S. Cl. .............. 703/14; 703/22; 716/106
(58) Field of Classification Search ........... 703/13, 703/14, 17, 22, 26, 15; 716/10, 106; 717/155; 714/32

See application file for complete search history.

(56) References Cited

U.S. PATENT DOCUMENTS

| | | | |
|---|---|---|---|
| 3,662,401 A | 5/1972 | Collins et al. | |
| 5,212,650 A | 5/1993 | Hooper et al. | |
| 5,369,763 A | 11/1994 | Biles | |
| 5,604,895 A * | 2/1997 | Raimi | 703/13 |
| 5,696,772 A * | 12/1997 | Lesmeister | 714/32 |
| 6,117,181 A | 9/2000 | Dearth et al. | |
| 6,195,627 B1 | 2/2001 | Bargh et al. | |
| 6,345,242 B1 | 2/2002 | Dearth et al. | |
| 6,393,426 B1 | 5/2002 | Odom et al. | |
| 6,466,898 B1 * | 10/2002 | Chan | 703/17 |
| 6,519,612 B1 | 2/2003 | Howard et al. | |
| 6,557,147 B1 * | 4/2003 | Lee et al. | 716/106 |
| 6,618,839 B1 | 9/2003 | Beardslee et al. | |
| 6,668,364 B2 | 12/2003 | McElvain et al. | |
| 6,687,710 B1 | 2/2004 | Dey | |
| 6,720,565 B2 | 4/2004 | Innes et al. | |
| 6,751,583 B1 | 6/2004 | Clarke et al. | |
| 6,754,763 B2 | 6/2004 | Lin | |
| 7,203,633 B2 * | 4/2007 | Gabele et al. | 703/15 |
| 7,206,732 B2 | 4/2007 | Williams et al. | |
| 2002/0019969 A1 | 2/2002 | Hellestrand et al. | |
| 2002/0032559 A1 | 3/2002 | Hellestrand et al. | |

(Continued)

OTHER PUBLICATIONS

Silver, David, Office Action dated Feb. 1, 2010; U.S. Appl. No. 11/930,866.

*Primary Examiner* — Kandasamy Thangavelu
(74) *Attorney, Agent, or Firm* — Dillon & Yudell LLP

(57) ABSTRACT

A design is simulated utilizing a hardware description language (HDL) simulation model by stimulating the HDL simulation model with a testcase. The HDL simulation model includes instrumentation not forming a portion of the design that includes a count event counter for a count event in the design, and the simulation includes counting occurrences of the count event in the count event counter to obtain a count event value. A threshold is also established for an aggregate count event value for the count event counter. After completion of the testcase, a determination is made whether addition of the count event value to the aggregate count event value for the count event counter would cause the aggregate count event value to exceed the threshold. If not, the count event value is recorded in a testcase data storage area, and the count event value is accumulated in the aggregate count event value. If so, the count event value is discarded without recording the count event value in the testcase data storage area.

19 Claims, 22 Drawing Sheets

U.S. PATENT DOCUMENTS

| | | |
|---|---|---|
| 2002/0049576 A1 | 4/2002 | Meyer |
| 2002/0152060 A1 | 10/2002 | Tseng |
| 2003/0101382 A1 | 5/2003 | Gabele et al. |
| 2003/0121011 A1 | 6/2003 | Carter |
| 2003/0135354 A1 | 7/2003 | Gabele et al. |
| 2003/0144828 A1 | 7/2003 | Lin |
| 2003/0188299 A1 | 10/2003 | Broughton et al. |
| 2003/0237078 A1* | 12/2003 | Williams et al. .............. 717/155 |
| 2005/0049842 A1* | 3/2005 | Roesner et al. ................. 703/14 |
| 2005/0102125 A1 | 5/2005 | Tseng |
| 2005/0125754 A1 | 6/2005 | Schubert et al. |
| 2005/0149313 A1* | 7/2005 | Roesner et al. ................. 703/22 |
| 2006/0190239 A1* | 8/2006 | Piper et al. ..................... 703/26 |
| 2006/0259889 A1* | 11/2006 | Crosetto ........................ 716/10 |

* cited by examiner

```
ENTITY FXUCHK IS

PORT(   S_IN      :   IN std_ulogic;
            Q_IN      :   IN std_ulogic;
            R_IN      :   IN std_ulogic;
            clock     :   IN std_ulogic;
            fails     :   OUT std_ulogic_vector(0 to 1);
            counts    :   OUT std_ulogic_vector(0 to 2);
            harvests  :   OUT std_ulogic_vector(0 to 1);
        );
```
⎫ 450

452 { --!! BEGIN
     --!! Design Entity: FXU;

453 { --!! Inputs
     --!! S_IN     => B.C.S;
     --!! Q_IN     => A.Q;
     --!! R_IN     => R;
     --!! CLOCK    => clock;
     --!! End Inputs 454 { --!! Fail Outputs;
     --!! 0 : "Fail message for failure event 0";
     --!! 1 : "Fail message for failure event 1";
     --!! End Fail Outputs;

455 { --!! Count Outputs;
     --!! 0 : <event0> clock;
     --!! 1 : <event1> clock;
     --!! 2 : <event2> clock;
     --!! End Count Outputs;

456 { --!! Harvest Outputs;
     --!! 0 : "Message for harvest event 0";
     --!! 1 : "Message for harvest event 1";
     --!! End Harvest Outputs;

457 { --!! End;

ARCHITECTURE example of FXUCHK IS

BEGIN

... HDL code for entity body section ...   } 458

END;

```
ENTITY X IS

PORT(  :
             :
             :
           );

ARCHITECTURE example of X IS

BEGIN
    .
    .
    .
    ... HDL code for X ...
    .
    .
    .

1221 {  Y:Y
        PORT MAP(  :
                   :
                 );

1222 {  A <= ....
        B <= ....
        C <= ....
                                        ⎯1230
1223 {  --!! [count, countname0, clock] <= Y.P;        ⎯1232
        --!! Q <= Y. [B1.count.count1] AND A;          ⎯1234
        --!! [fail, failname0, "fail msg"] <= Q XOR B;
        --!! [harvest, harvestname0, "harvest msg"] <= B AND C;
                                        ⎯1236
END;
```

Fig. 6B

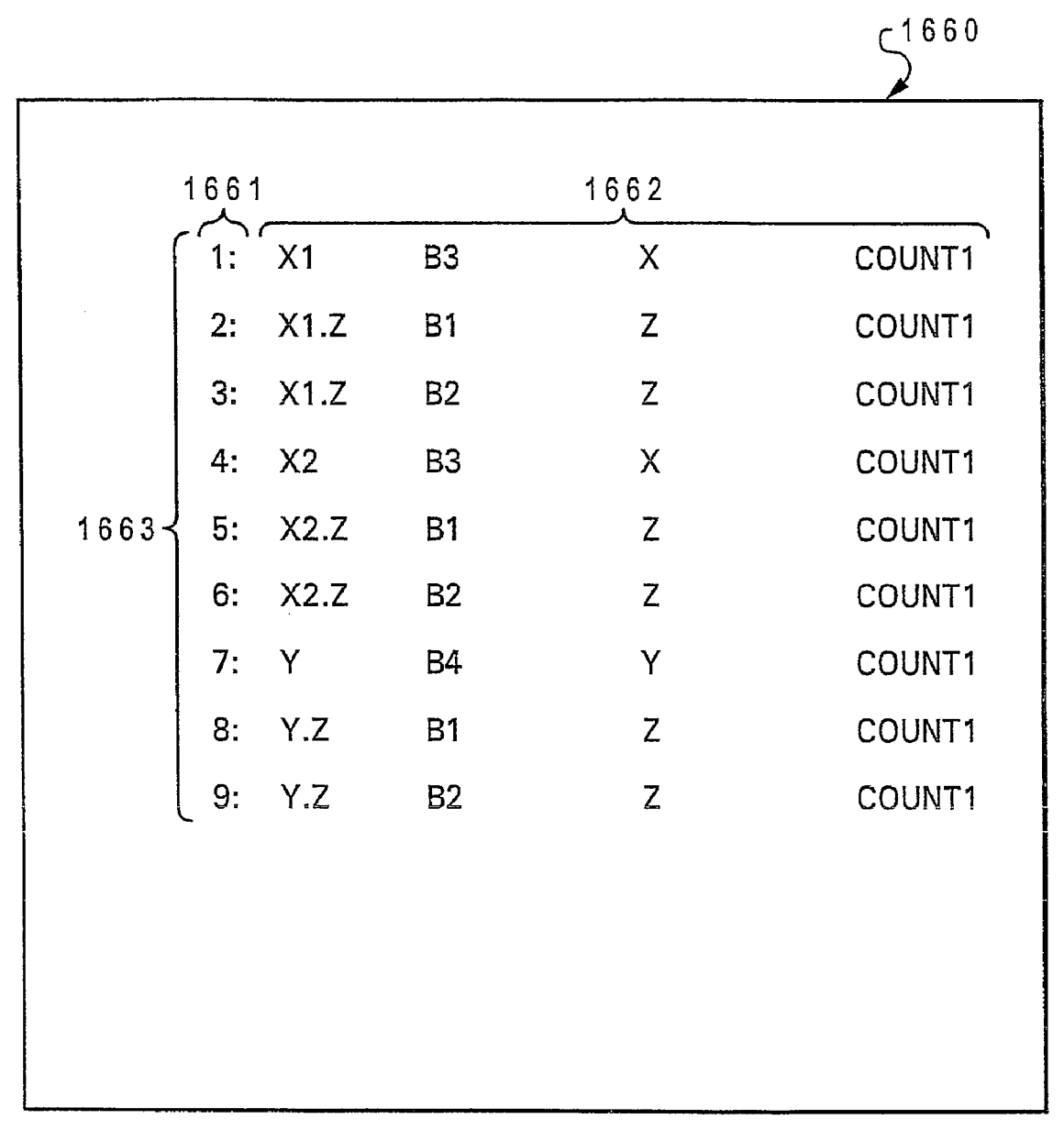

|   | 1661 | 1662 | | |
|---|---|---|---|---|
| 1: | X1 | B3 | X | COUNT1 |
| 2: | X1.Z | B1 | Z | COUNT1 |
| 3: | X1.Z | B2 | Z | COUNT1 |
| 4: | X2 | B3 | X | COUNT1 |
| 5: | X2.Z | B1 | Z | COUNT1 |
| 6: | X2.Z | B2 | Z | COUNT1 |
| 7: | Y | B4 | Y | COUNT1 |
| 8: | Y.Z | B1 | Z | COUNT1 |
| 9: | Y.Z | B2 | Z | COUNT1 |

1660

1663 brackets rows 1-9

Fig. 7

DEFINING AND RECORDING THRESHOLD-QUALIFIED COUNT EVENTS OF A SIMULATION BY TESTCASES

CROSS-REFERENCE TO RELATED APPLICATIONS

The present application is also related to the following patent documents:

(1) U.S. patent application Ser. No. 10/116,524, filed Apr. 4, 2002; and (2) U.S. Pat. No. 7,203,633 B2.

The above-mentioned patent applications are assigned to the assignee of the present invention and incorporated herein by reference in their entireties.

BACKGROUND OF THE INVENTION

1. Technical Field

The present invention relates in general to designing and simulating digital devices, modules and systems, and in particular, to a method and system for computer simulation of digital devices, modules and systems utilizing a hardware description language (HDL) model.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli (i.e., testcase) representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

Simulation engineers and designers frequently analyze simulation results by the number of occurrences of specific events during simulation. It is often the case that event counts are not statistically interesting to a designer or simulation engineer if fewer than some number of event occurrences happen during the simulation of a testcase. The present invention therefore recognizes that it would be useful and desirable for a simulation engineer or designer to know not only the aggregate number of occurrences of events in a simulation model, but also to qualify the recording of occurrences of selected events during a simulation run with thresholds.

SUMMARY OF THE INVENTION

According to a one method of simulation processing, a design is simulated utilizing a hardware description language (HDL) simulation model by stimulating the HDL simulation model with a testcase. The HDL simulation model includes instrumentation not forming a portion of the design that includes a count event counter for a count event in the design, and the simulation includes counting occurrences of the count event in the count event counter to obtain a count event value. A threshold is also established for an aggregate count event value for the count event counter. After completion of the testcase, a determination is made whether addition of the count event value to the aggregate count event value for the count event counter would cause the aggregate count event value to exceed the threshold. If not, the count event value is recorded in a testcase data storage area, and the count event value is accumulated in the aggregate count event value. If so, the count event value is discarded without recording the count event value in the testcase data storage area.

BRIEF DESCRIPTION OF THE DRAWINGS

FIG. 4C illustrates exemplary sections of HDL syntax that maybe utilized in accordance with the teachings of the present invention;

FIG. 6B illustrates an exemplary HDL file for implementing instrumentation logic within an HDL design entity in accordance with the teachings of the present invention;

FIG. 7 illustrates an eventlist file 1660 for the count events of simulation model 1000 shown in FIG. 10A;

DETAILED DESCRIPTION OF A PREFERRED EMBODIMENT

The present invention provides for accurate and comprehensive monitoring of a digital circuit design in which a designer creates instrumentation modules utilizing the same hardware description language (HDL) as utilized for the design itself. HDLs, while suited to the needs of digital designers can also be effectively utilized for a number of checking functions. In accordance with the Method and System of the present invention, instrumentation modules are utilized to monitor specified design parameters while not becoming compiled as an integral part of the design itself. Furthermore, since the instrumentation modules can be written in the same HDL as utilized in the actual design, such modules are platform and simulator independent. Unlike checking done with C or C++ programs, HDL instrumentation can be compiled and run directly without loss of performance on hardware simulators.

Figure 1:
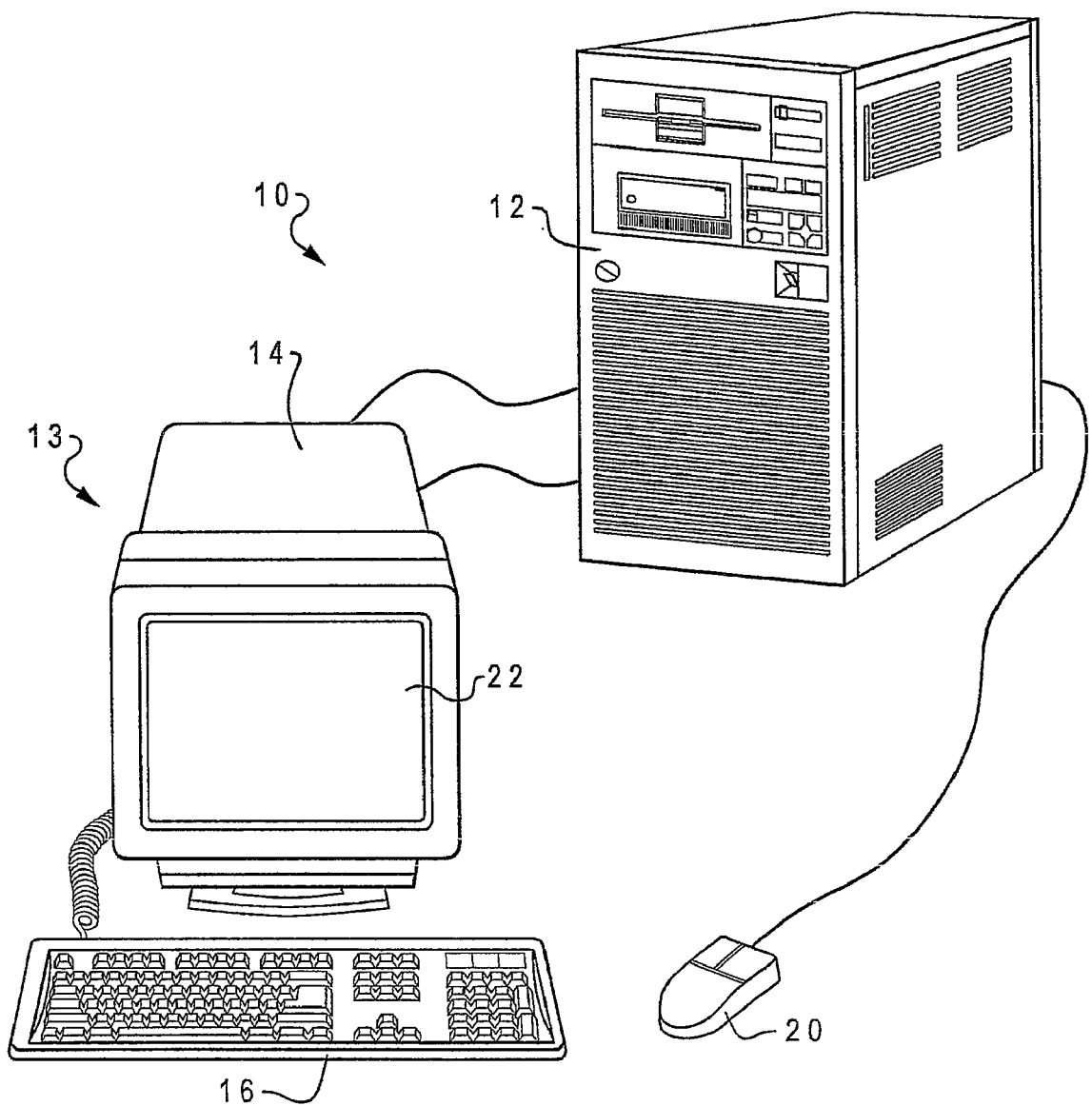
FIG. 1 is a pictorial representation of a data processing system.

With reference now to the figures, and in particular with reference to FIG. 1, there is depicted a pictorial representation of a data processing system 10 with which the present invention may be advantageously utilized. As illustrated, data processing system 10 comprises a workstation 12 to which one or more nodes 13 are connected. Workstation 12 preferably comprises a high performance multiprocessor computer. Workstation 12 preferably includes nonvolatile and volatile internal storage for storing software applications comprising an ECAD system, which can be utilized to develop and verify a digital circuit design in accordance with the method and system of the present invention. As depicted, nodes 13 are comprised of a display device 14, a keyboard 16, and a mouse 20. The ECAD software applications executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow.

Figure 2:
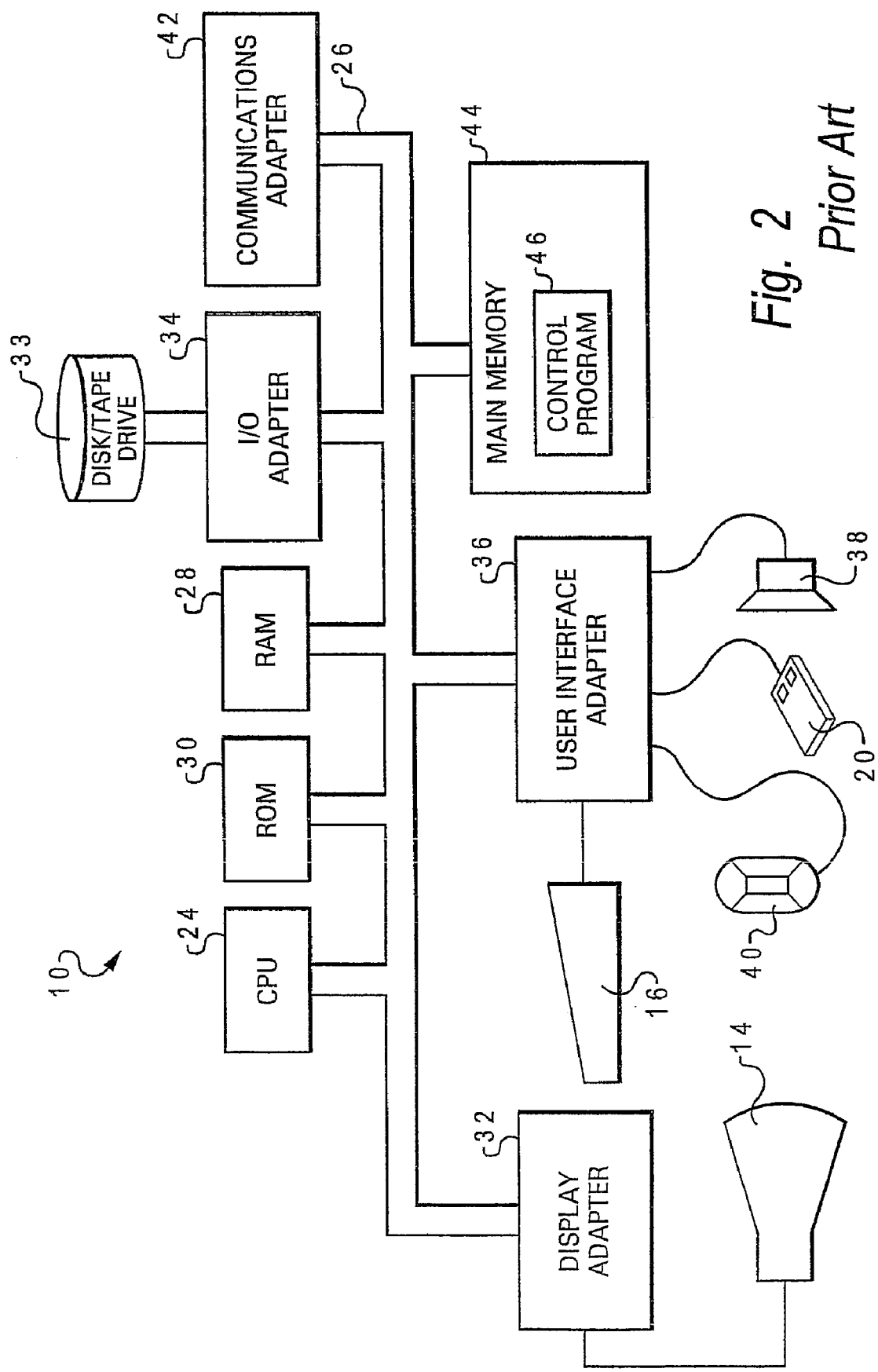
FIG. 2 depicts a representative hardware environment of the data processing system illustrated in FIG. 1.

FIG. 2 depicts a representative hardware environment of data processing system 10. Data processing system 10 is configured to include all functional components of a computer and its associated hardware. Data processing system 10 includes one or more processors, such as Central Processing Unit (CPU) 24, as well as a number of other units interconnected via system bus 26. Although not explicitly depicted in FIG. 2, processors such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in a system unit such as workstation 12 of FIG. 1.

Data processing system 10 further includes random-access memory (RAM) 28, read-only memory (ROM) 30, display adapter 32 for connecting system bus 26 to display device 14, and I/O adapter 34 for connecting peripheral devices (e.g., disk and tape drives 33) to system bus 26. RAM 28 is a type of memory designed such that the location of data stored in it is independent of the content. Also, any location in RAM 28 can be accessed directly without having to work through from the beginning. ROM 30 is a type of memory that retains information permanently and in which the stored information cannot be altered by a program or normal operation of a computer.

Display device 14 provides the visual output of data processing system 10. Data processing system 10 further includes user interface adapter 36 for connecting keyboard 16, mouse 20, speaker 38, microphone 40, and/or other user interface devices, such as a touch-screen device (not shown), to system bus 26. Communications adapter 42 connects data processing system 10 to a computer network. Although data processing system 10 is shown to contain only a single CPU and a single system bus, it should be understood that the present invention applies equally to computer systems that have multiple CPUs and to computer systems that have multiple buses that each perform different functions in different ways.

Data processing system 10 also includes an interface that resides within a machine-readable media to direct the operation of data processing system 10. Any suitable machine-readable media may retain the interface, such as RAM 28, ROM 30, a magnetic disk, magnetic tape, or optical disk (the last three being located in disk and tape drives 33). Any suitable operating system and associated interface (e.g., Microsoft Windows) may direct CPU 24. For example, the AIX operating system and AIX Windows windowing system can direct CPU 24. Other technologies also can be utilized in conjunction with CPU 24, such as touch-screen technology or human voice control.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 44 is connected to system bus 26, and includes a control program 46. Control program 46 resides within main memory 44, and contains instructions that, when executed on CPU 24, carries out some or all of the operations described herein.

Figure 3A:
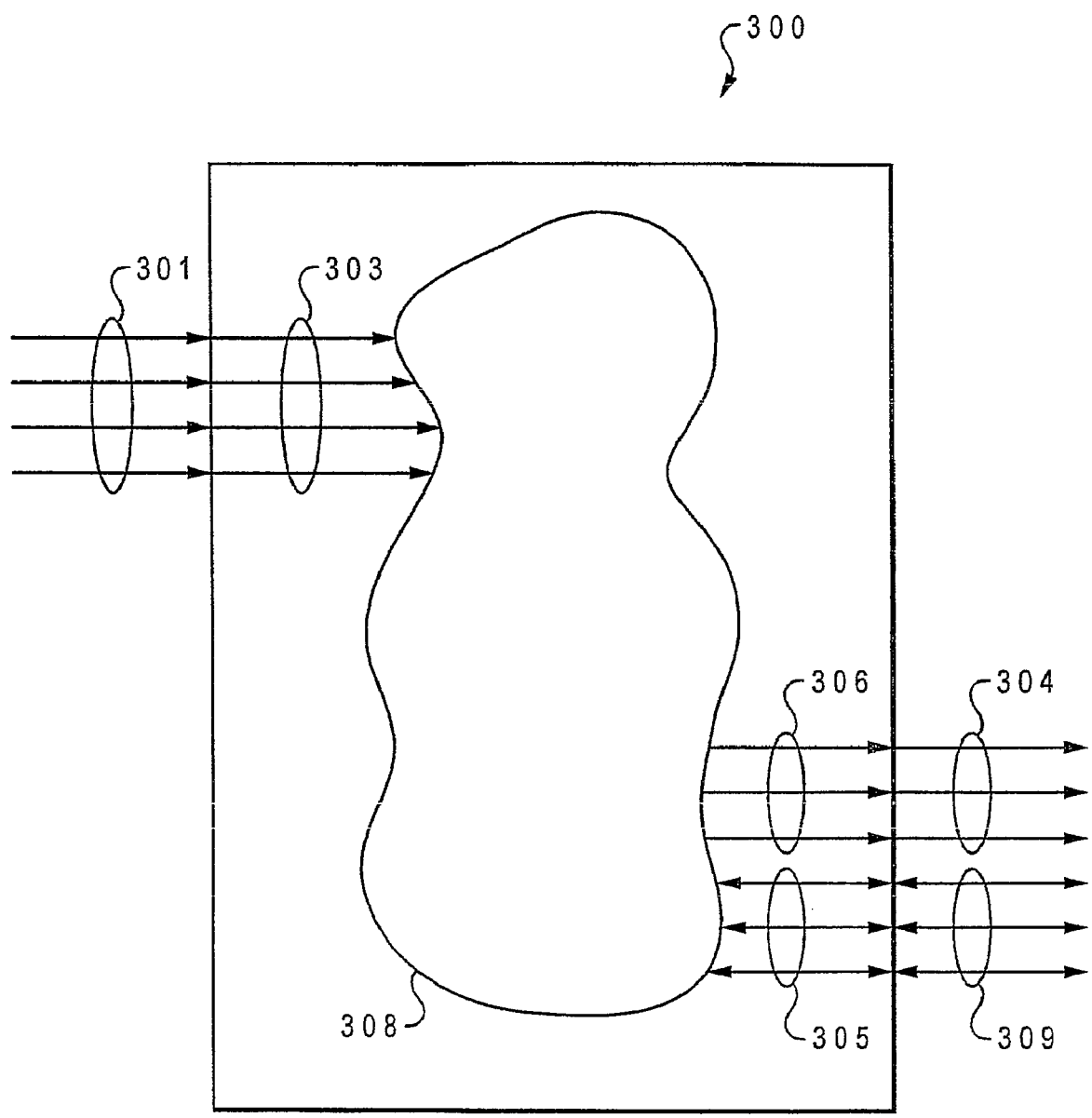
FIG. 3A is a simplified block diagram illustrating a digital design entity that may be instrumented in accordance with the teachings of the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
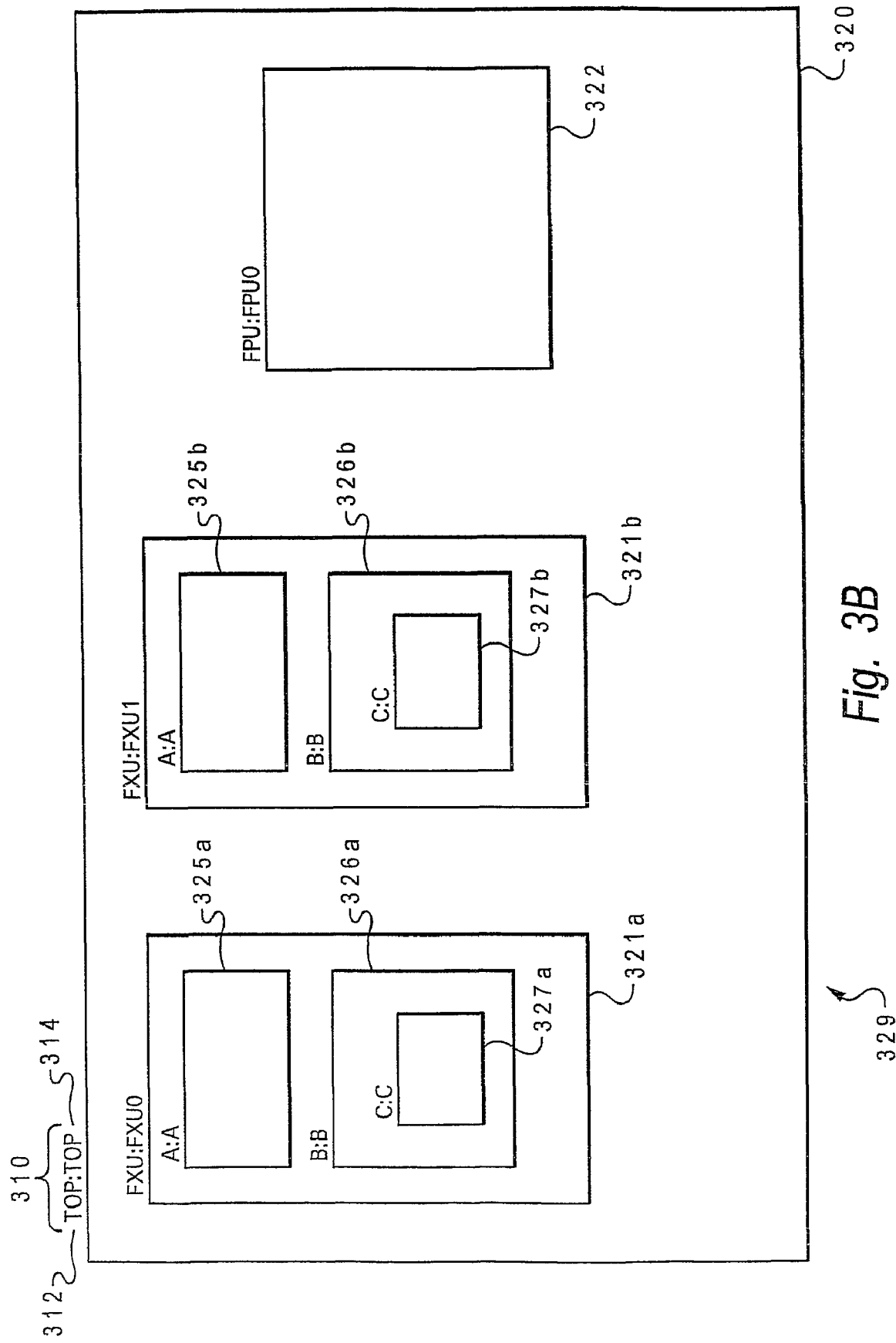
FIG. 3B is a diagrammatic representation depicting a simulation model that may be instrumented in accordance with the teachings of the present invention.

Referring now to FIG. 3B, there is illustrated a diagrammatic representation of an exemplary simulation model 329 that may be utilized in a preferred embodiment of the present invention. Simulation model 329 comprises multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 includes top-level entity 320, which directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

In order to instrument simulation models, the present invention makes use of entities known as "instrumentation entities," which are in contrast to the entities constituting a design, which are referred to herein as "design entities". As with design entities, instrumentation entities are described by one or more HDL source code files and comprise a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
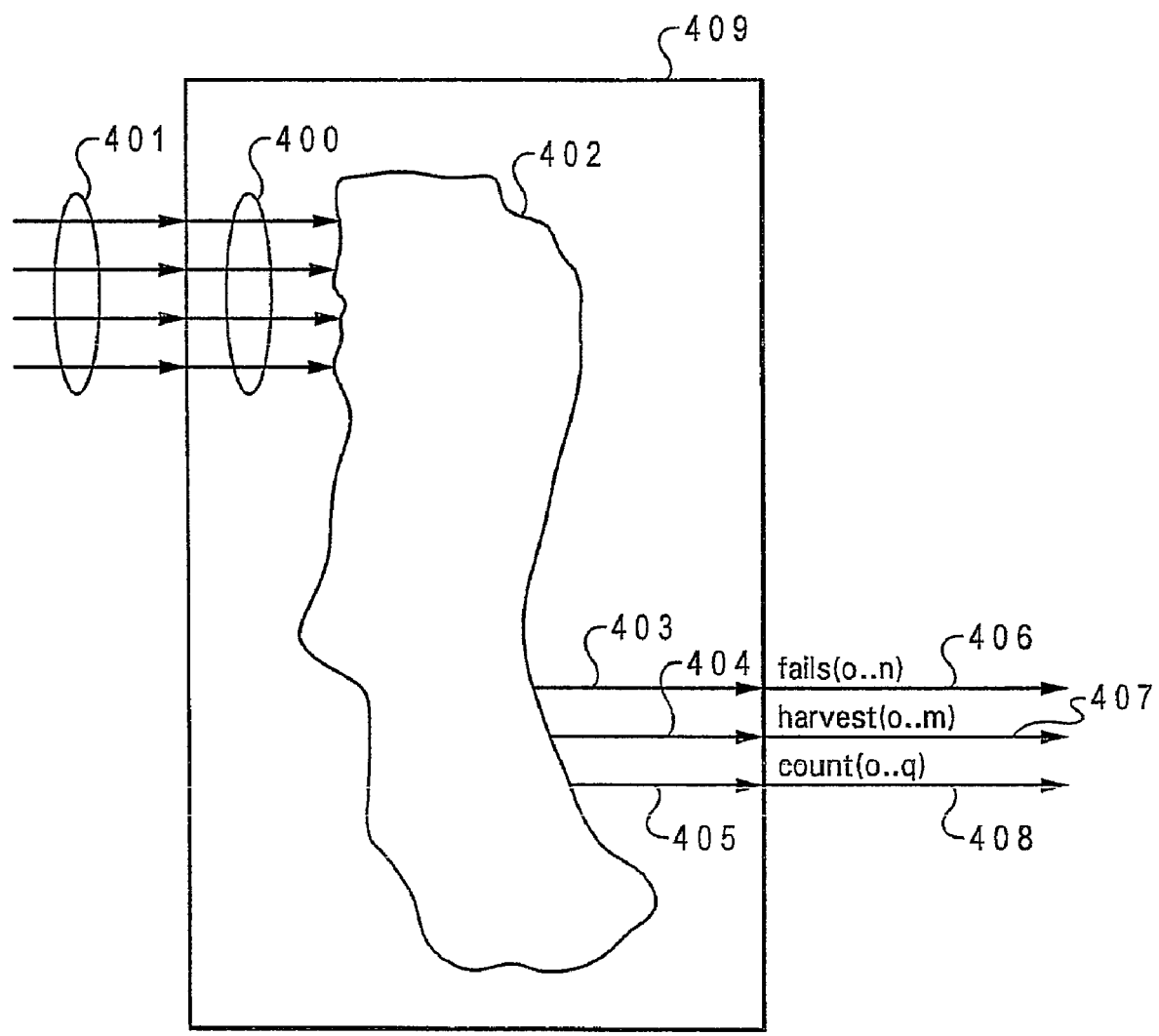
FIG. 4A is a simplified block diagram representative of an instrumentation entity.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. At least three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 4B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 4B:
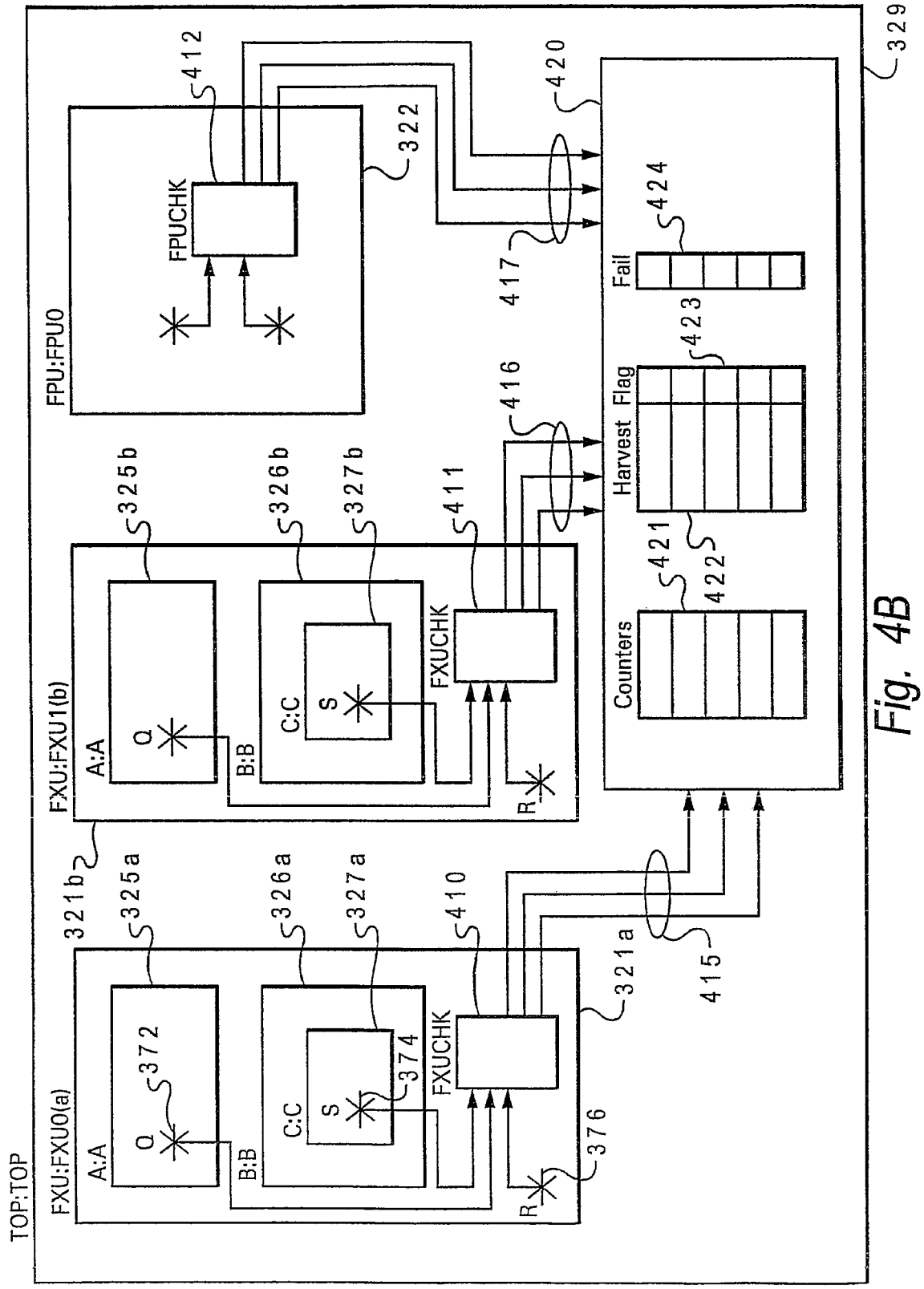
FIG. 4B is a simplified block diagram of a simulation model instrumented in accordance with the teachings of the present invention.

With reference now to FIG. 4B, there is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321a and 321b of an FXU entity. For each FXU instantiations of 321a and 321b, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 4B, entity FXUCHK monitors a signals Q 372, a signal R 376, and a signal S 374 within each of instances 321a and 321b of the FXU entity. Signal Q 372, is a signal within the instances 325a and 325b of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by event (e.g., fail, count, and harvest) signals to instrumentation logic block 420 containing logic for recording occurrences of each of the event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary HDL file 440 that describes instrumentation entity FXUCHK depicted in FIG. 4B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 4C depicts one embodiment of the present invention in which comments begin with two exclamation points in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports are declared: fails (0 to 1), counts (0 to 2), and harvests (0 to 1). These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which consists of the instance names of the entities within the target entity each separated by periods ("."). This identification string is prepended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connection. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 4B. The variable name provides a means to identify and reference the particular counter associated with a particular count event. Thus, a comment of the form "--!! n: <varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

In the embodiments illustrated in FIGS. 5A, 5B, 5C, and 5D, embodiments of the present invention are described with respect to count events. One skilled in the art will appreciate and understand the extensions necessary to apply the same techniques to other event classes such as failures or harvests.

Figure 5A:
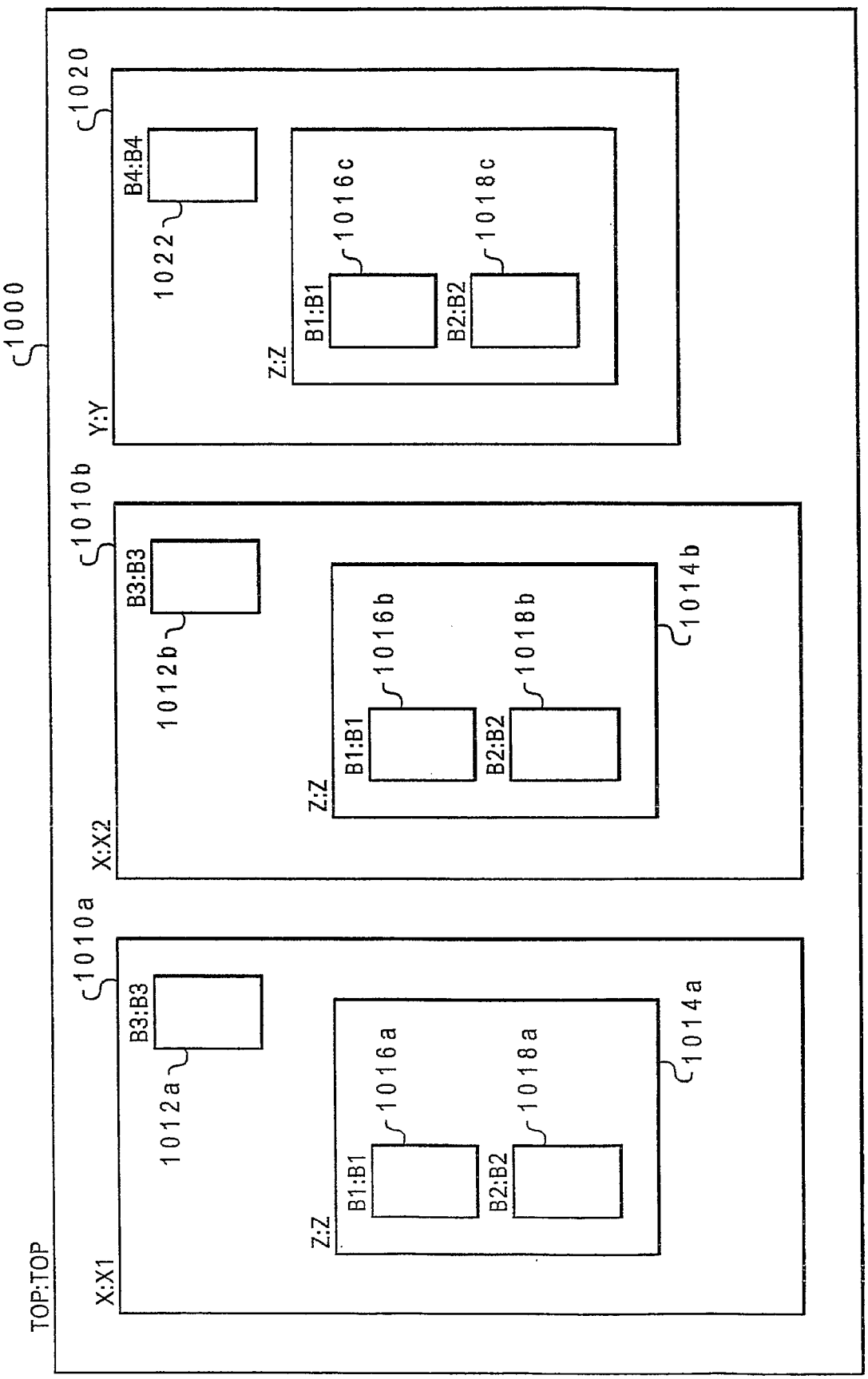
FIG. 5A is a block diagram illustrating a simulation model containing a number of design and instrumentation entities.

With reference to FIG. 5A, there is depicted a block diagram representation of simulation model 1000 containing a number of design and instrumentation entities. As illustrated in FIG. 5A, simulation model 1000 includes two instances of a design entity X, with instance names X1 and X2 respectively.

Within each of design entity instances X1 and X2 is instantiated an instance of an instrumentation entity B3, 1012a and 1012b. Design entity instances X1 and X2 further comprise instances, 1014a and 1014b, respectively, of design entity Z which further contains instances, 1016a and 1016b, of instrumentation entity B1 and instances, 1018a and 1018b, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016c and 1018c, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the method and system of the present invention, the user must uniquely name each type of event (e.g., count, fail, or harvest) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

Figures 5B, 5C, 5D:
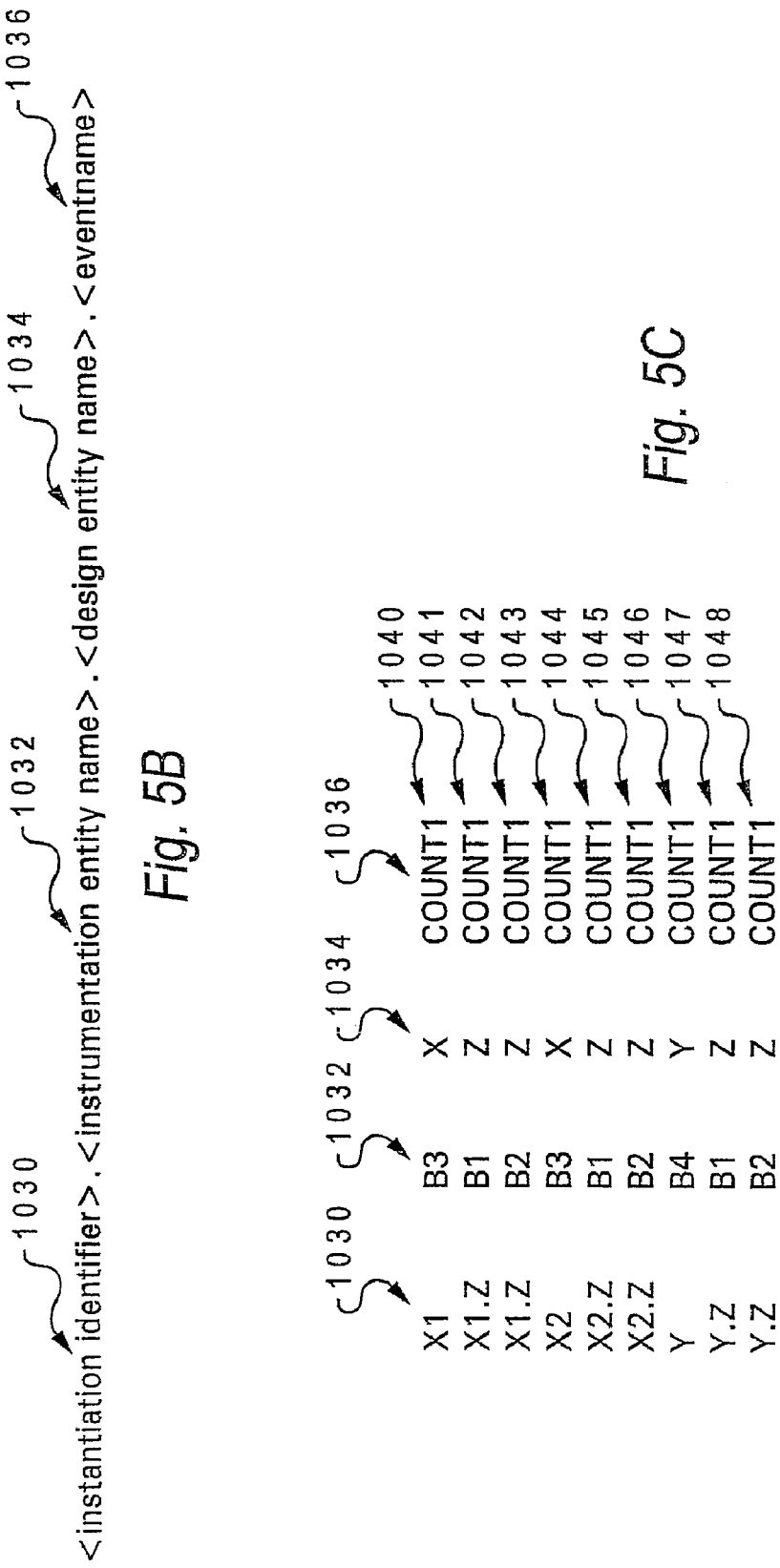
FIG. 5B depicts a data structure for declaring an event within a simulation model in accordance with one embodiment of the present invention.
FIG. 5C illustrates a list of extended event data structures for the simulation model in FIG. 10A.
FIG. 5D depicts a data structure for declaring an event within a simulation model in accordance with an alternate embodiment of the present invention.

With reference to FIG. 5B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, consists of the instance identifiers, proceeding from the top level entity to the direct ancestor of the given instance within the simulation model separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 5C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entity name is not included within the extended event identifier. Referring to FIG. 5D, such an alternative extended event identification data structure is depicted. As shown in FIG. 5D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 5D provides for simpler naming and referencing of events at the expense of requiring the user to prevent name collisions for events associated with a given design entity.

Returning to FIG. 5B, the combination of instrumentation entity field 1032, design entity name field 1034, and eventname field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 5C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count 1 event of instrumentation entity B1 within the X1.Z instance of design entity Z utilizes the following count eventname:

| X1.Z | B1 | Z | COUNT1, | which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 6A and 6B, the present invention further provides for a more flexible implementation of instrumentation logic in a more unstructured manner.

Figure 6A:
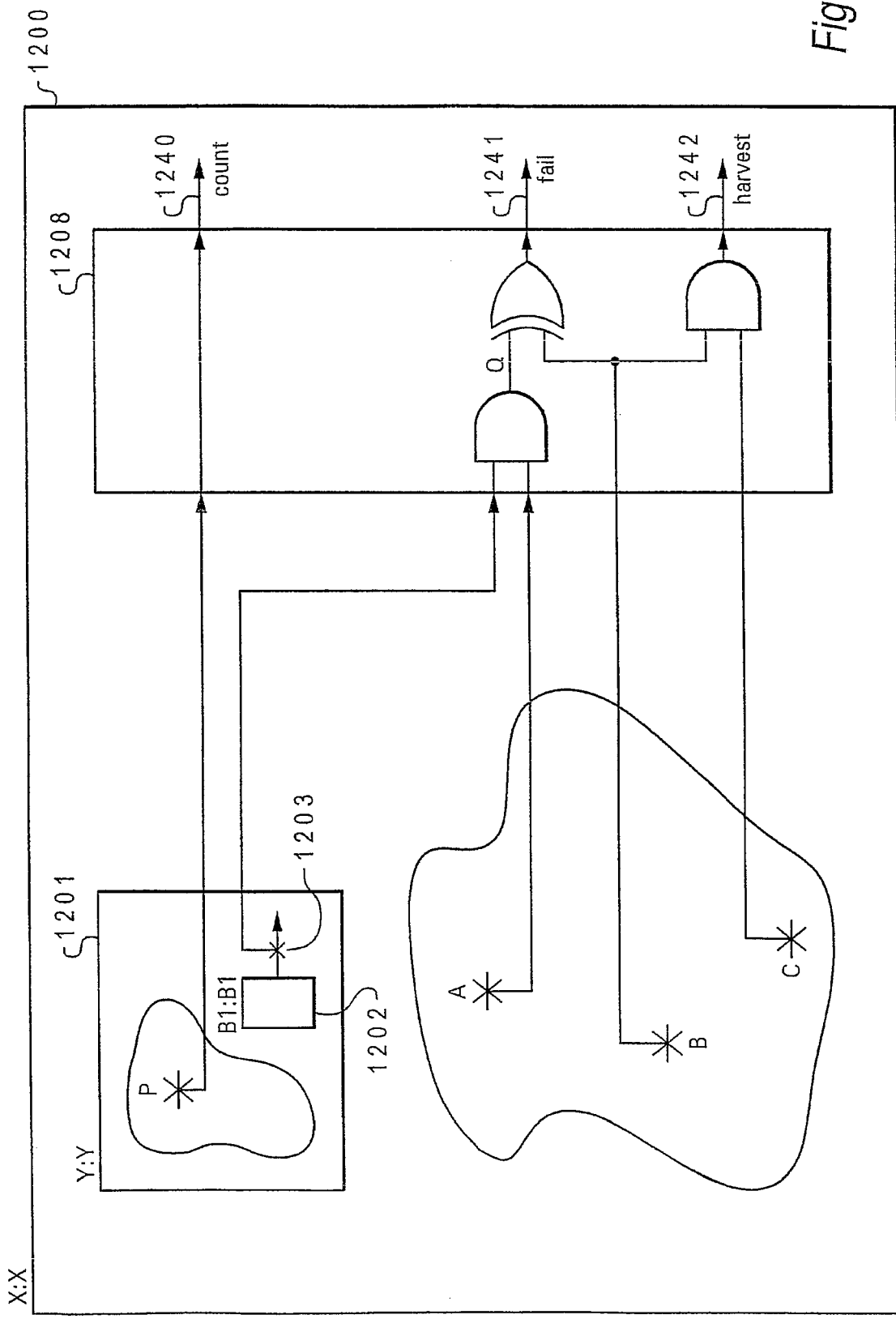
FIG. 6A depicts a representative target design entity with an instrumentation entity containing random instrumentation logic implemented in accordance with the teachings of the present invention.

It is often necessary to tailor instrumentation logic to address unique problems and circumstances. Instrumentation logic of a specific and yet non-predefined nature that is designed in accordance with the techniques disclosed herein with reference to FIGS. 6A and 6B is referred herein as "random instrumentation logic." A data construct including general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, one instrumentation technique employs a separate HDL file in which the instrumentation entity is described. As explained with reference to FIGS. 6A and 6B, design entities within a simulation model may also be instrumented within a design entity source code file, thus avoiding the design process overhead of creating a separate instrumentation entity HDL file.

In accordance with the teachings of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 6A, there is illustrated a representative target design entity 1200 wherein random instrumentation logic is implemented in accordance with a preferred embodiment of the present invention. Instantiated within target design entity 1200 is a design entity 1201. As further depicted in FIG. 6A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 6A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. The HDL compiler recognizes the unconventional comments in addition to any comments utilized to instantiate embedded instrumentation entities within design entity 1200. During the post-compilation/model build phase, an instrumentation load tool processes these comments in a manner similar to that utilized for embedded instrumentation entities (described with reference to FIGS. 5A-5D) to generate instrumentation entity 1208.

A variety of possible syntaxes can be utilized to formulate the unconventional HDL comments required for generating random instrumentation logic within the source code file of a target design entity. As depicted in FIG. 6B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 6B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

$$\{l.h.s.\}<=\{r.h.s\};$$

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression within bracket characters ("[A, A]") that generates a new event. Within comments 1223, a statement 1230 produces a count event 1240 from instrumentation entity 1208 (FIG. 6A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 4C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by the instrumentation load tool 464 during processing. Signals declared by an lhs expression may be incorporated within an rhs expression as shown in lines 1232 and 1234.

An rhs includes logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y.

[B1.count.count1]" connects instrumentation entity 1208 to instrumentation event 1203. This notation permits instrumentation events at any level of design hierarchy within target design entity 1200 to be directly accessed.

As further depicted in FIG. 6B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

Simulation of a given model is typically controlled by a program, hereinafter referred to as RTX (Run Time eXecutive), that is written in a high-level language such as C or C++. To facilitate RTX control and execution of a simulation run, simulators typically provide a number of application program interface (API) functions that may be called by the RTX. Such API functions employ routines, protocols, and tools that allow for polling of signals within the simulation model, alteration of signals within a simulation model, cycling a simulation model, etc.

In order to provide for the control and monitoring of instrumentation events within simulation models executing on a batch simulation farm, one or more general-purpose computers, hereinafter referred to as "instrumentation servers", are added to batch simulation farms. An instrumentation server acts as a centralized repository for information used to control instrumentation events and for data gathered from instrumentation events during simulation runs. The exact nature and function of the control information and of the gathered data varies with the type of event (i.e., fail events vs. count events), as will be described below.

In order to allow for effective management of instrumentation events, a set of "eventlist" files (described with reference to FIGS. 5A-5D) contain information about the exact number and content of the instrumentation events in a given model. The eventlist files are created at model build time by the instrumentation load tool. These files, one per class of events (e.g., fail, count, harvest, etc.), list the particular events in the given simulation model. Each simulation model has a unique set of corresponding eventlist files that are created at model build time.

When instrumentation events are created at model build time, they are constructed in a specific order, and a unique index is assigned within the eventlist file to each instrumentation event for a given event class. Accesses to instrumentation events by API routines make use of these index values. Furthermore, when an API routine communicates aggregate data with respect to all events within a given event class to the instrumentation server, this aggregate data is sequentially ordered according to these index values.

Each eventlist file contains a list of the instrumentation events for a given event class within the model. These events are named in accordance with the naming convention data structures described above in conjunction with FIGS. 5A-5C, which provides unique names for each of the instrumentation events. Referring back to FIG. 5A in conjunction with FIG. 7, there is shown an eventlist file 1660 for the count events of simulation model 1000 of FIG. 5A.

Eventlist file 1660 contains multiple count event class entries 1663. Each of count event class entries 1663 includes a unique, sequential index value 1661, and an extended event identifier 1662. Each of indices 1661 corresponds to the index of a particular event (in this case count event COUNT1) assigned at model build time. Extended event identifiers 1662 provide an event name associated with each individual event index. Eventlist file 1660 thus provides a mapping between the instrumentation event names and the instrumentation event indices as well as providing an ordering convention for aggregate data for a class of instrumentation events. Eventlist files, such as eventlist file 1660, are used by the instrumentation server to aid in the control and monitoring of instrumentation events in simulation models.

Figure 8A:
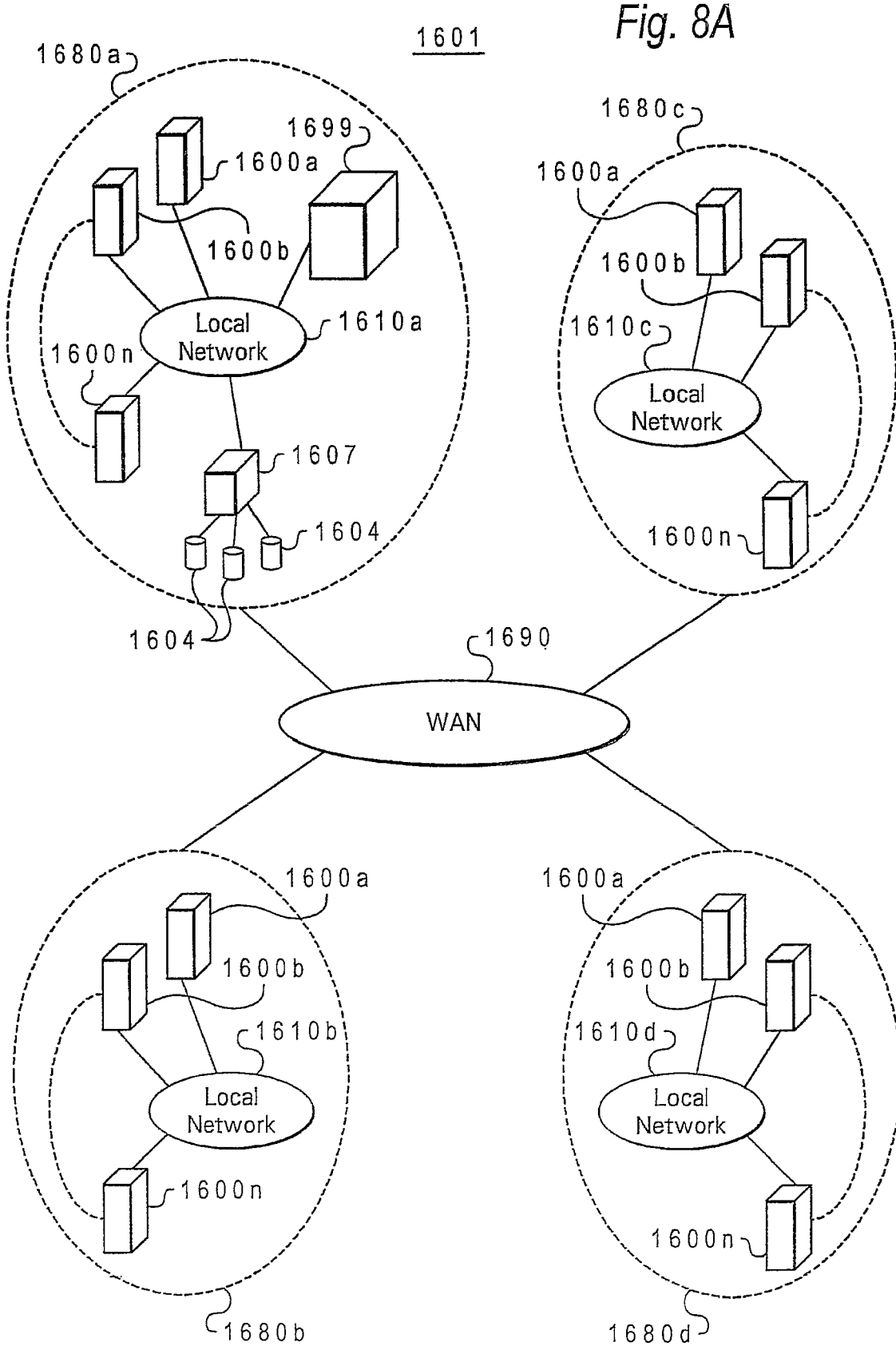
FIG. 8A depicts a batch simulation farm in which a preferred embodiment of the present invention may be implemented.

With reference now to FIG. 8A, there is illustrated a batch simulation farm 1601 in which a preferred embodiment of the present invention may be implemented. Batch simulation farm 1601 includes geographically distant simulation farm nodes 1680a-1680d. Within these nodes, general-purpose computers 1600a-1600n are interconnected via local area networks (LANs) 1610a-1610d. LANs 1610a-1610d are further connected by means of a wide-area network (WAN) 1690, which provides communication among multiple simulation farm nodes 1680a-1680d. Those skilled in the art will recognize that many possible network topologies are possible for a batch simulation farm.

One such general-purpose computer 1607, together with a set of disk storage devices 1604 serve as a shared file system, which is accessible to all general-purpose computers within simulation farm nodes 1680a-1680d. Exemplary batch simulation farm 1601 has been shown with one shared file system server in a particular geographic node. Those skilled in the art will recognize that it is possible for the shared file system to be implemented as multiple general-purpose computers and disk devices across the different geographic nodes in the batch simulation farm. Further, it is possible for each distinct geographic node to have a unique shared file system. Such unique file systems are usually accessible to all nodes, but are most advantageously accessed within the local network node wherein the file system resides.

Within simulation farm node 1680a, a particular general-purpose computer serves as an instrumentation server 1699. Although a single instrumentation server is described with reference to the batch simulation farm environment shown in the figures, those skilled in the art will understand the extensions necessary to distribute the functionality of the instrumentation server across several physical general-purpose computers.

General-purpose computers 1600a-1600n within simulation farm nodes 1680a-1680d utilize software or hardware simulators to perform simulation tests on various digital design simulation models. In addition, certain designated general-purpose computers 1600 within batch simulation farm 1601 serve specific roles in the process of controlling and executing simulation tests as described below. Many of general-purpose computers 1600 may also be user machines that execute simulation tests as a secondary background function.

At any given time, a number of distinct versions of a simulation model for a given digital logic design may be undergoing simulation within batch simulation farm 1601. In addition, a number of different digital designs, each with their respective differing model versions, may be undergoing simulation. In such circumstances, each different model is typically given a name, hereinafter referred to as the "model name", which uniquely identifies both the particular digital design and the particular version of the simulation model for the given digital design.

One or more general-purpose computers 1600, hereinafter referred to as "model servers", are utilized to store the valid versions of simulation models currently available for execution within batch simulation farm 1601. Before simulation jobs can be executed within batch simulation farm 1601 with respect to a particular model, that model must be built, and a copy of the model placed on the model servers. In addition, the eventlist files for the model must be placed on instrumentation server 1699 to allow for the control and monitoring of the instrumentation events.

Within batch simulation farm 1601, one or more of general-purpose computers 1600*a*-1600*n*, referred to hereinafter as "testcase generators", are typically utilized to create simulation testcases for the various models under simulation. The testcase generators are responsible for generating tests to be executed and further packaging these tests into simulation jobs. A simulation job is an entity containing the simulation test and any controlling information and/or programs (such as RTX) that are necessary to execute the simulation test within batch simulation farm 1601.

Simulation jobs are passed from the testcase generators to one or more of general-purpose computers 1600*a*-1600*n* that are utilized as batch controllers, within batch simulation farm 1601. These batch controllers are responsible for dispatching simulation jobs to a general-purpose computer utilized as a simulation platform, herein after referred to as a "simulation client".

Once a simulation job arrives at a simulation client, the simulation client communicates with the model servers to obtain a copy of the simulation model corresponding to the particular simulation job. The model can be transferred to the simulation client by a number of means well known to those skilled in the art including, among others, a shared file system, File Transfer Protocol (FTP), or a custom file transport mechanism utilizing network communication protocols.

In addition, the simulation client communicates with instrumentation server 1699, the shared file system comprising general-purpose computer 1607 and disk storage devices 1604, or some combination thereof, in order to obtain the control information for the instrumentation events within the model. This control information is often stored on a per model basis by model name on instrumentation server 1699. The exact contents and nature of the communication between the simulation client and instrumentation server 1699 varies with the type of events within the model as explained in further detail below. The instrumentation event control information is used by API routines called by RTX to control the behavior of the instrumentation events within the simulation model.

As described further below in conjunction with the description of FIGS. 10A and 10C, certain control information relating to count events and threshold values for these events is stored on disk storage devices 1604. This information can be accessed from simulation clients without placing a load on instrumentation server 1699. In particular, the shared file system is utilized to store current count data and count threshold limit values. This information is utilized by simulation clients to determine whether the current testcase has exercised and counters that have not already reached their threshold values.

The simulation model is then loaded into either memory 44 or the hardware simulator within the simulation client. Model processing control is then passed to RTX for the execution of the simulation testcase. RTX executes the testcase until the successful completion of the test or an error condition (test fail) occurs.

Within batch simulation farm 1601, one or more of general-purpose computers 1600*a*-1600*n*, hereinafter referred to as "statistics servers", are utilized to store general statistics, such as cycles completed, number of passing tests executed, etc. concerning the execution of simulation jobs within batch simulation farm 1601. Likewise, one or more of general-purpose computers 1600*a*-1600*n*, hereinafter referred to as "failed testcase servers", are utilized to store simulation tests that have failed in order to facilitate the re-execution and debugging of these testcases.

At the conclusion of the execution of a testcase, whether due to successful execution or a failure, RTX communicates with the statistics server to record general statistics about the execution of the simulation job. Such communication can be accomplished in a number of ways well known to those skilled in the art including a shared file system, a direct network connection between RTX and the statistics server, a file transport mechanism, and others.

At the conclusion of a testcase, RTX also communicates the aggregate information concerning instrumentation events to instrumentation server 1699. This information is stored on instrumentation server 1699 for future analysis and in some cases is utilized to control instrumentation events in future simulation testcase runs for a given model. The exact nature of this communication varies for the different event classes as explained in further detail below.

If a testcase concludes due to a failure, RTX communicates with the failed testcase server to save those elements of the simulation job required to allow for the reproduction of the failed simulation testcase. The failed testcase server serves as a repository of failed tests that may be retrieved and re-executed in a foreground manner to allow for detailed investigation and problem resolution.

It is important to note that different simulation models typically require differing forms of testcases. What constitutes a testcase varies, often dramatically, between different simulation models. This is due to the varied techniques utilized in the present art for simulation of digital systems. In such circumstances, the failed testcase servers provide mechanisms capable of storing each of the various different forms of testcases.

In response to RTX communicating the general statistics for a simulation job to the statistics servers, communicating the aggregate statistics for the instrumentation events to instrumentation server 1699, and arranging for the storage of any failed simulation testcases on the failed testcase servers, RTX terminates and the simulation client is released. The batch controllers can then dispatch a new simulation job to the simulation client for execution. Those skilled in the art will recognize that many potential variations in the operation of a batch simulation farm are possible.

Figure 8B:
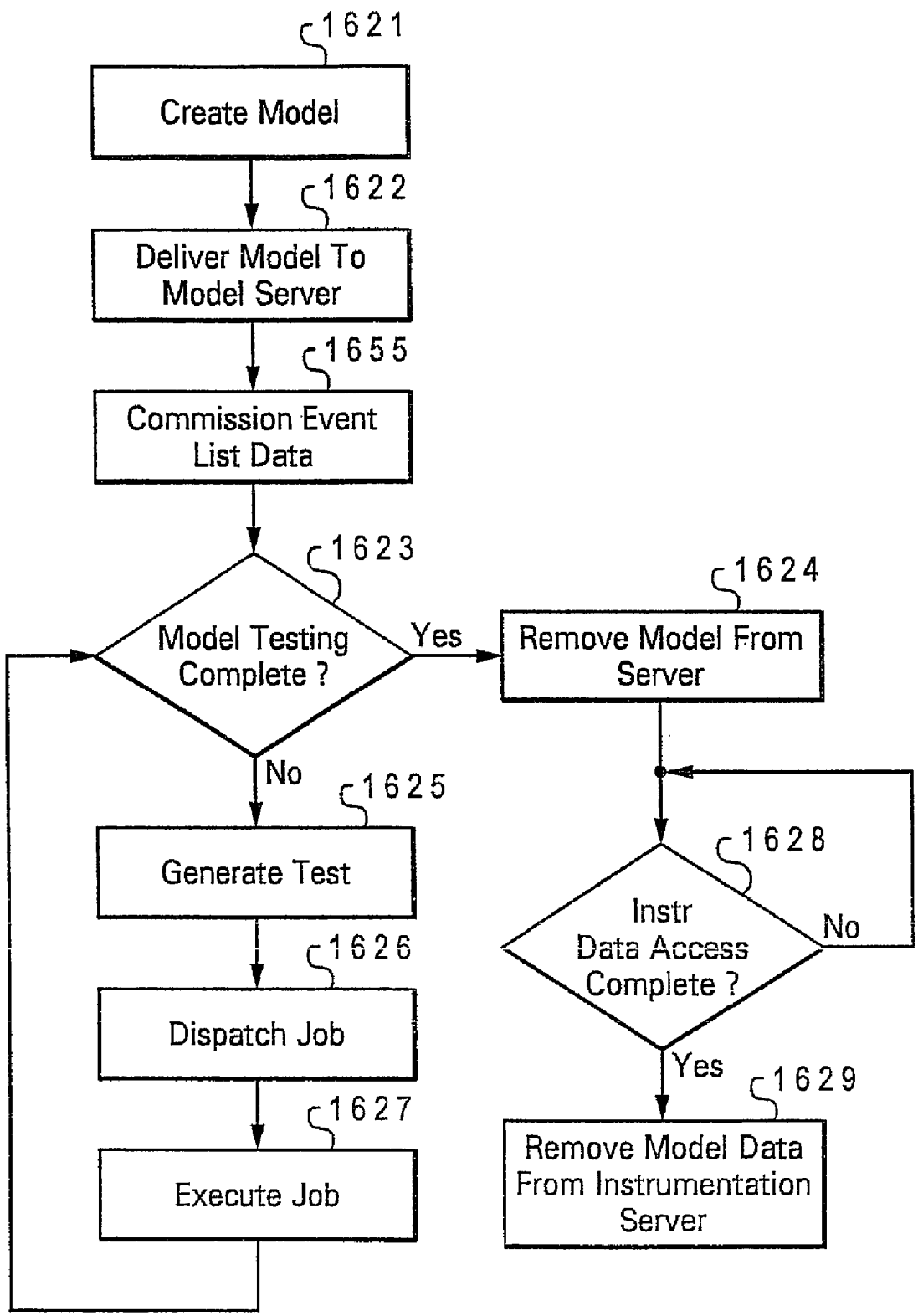
FIG. 8B is a flow diagram illustrating a progression of events from the creation of a specific simulation model to the removal of that model from batch simulation farm and instrumentation server in accordance with a preferred embodiment of the present invention.

With reference to the flowchart of FIG. 8B in conjunction with FIG. 7, there is depicted a progression of events from the creation of a specific simulation model to the removal of that model from batch simulation farm 1601 and instrumentation server 1699. The process begins at step 1621, which depicts the creation of the given simulation model. The simulation model is created in accordance with model build processes described hereinbefore.

Proceeding to step 1622, the model is placed on the model server to be available for simulation jobs executed within batch simulation farm 1601. Next, as illustrated at step 1655, the model eventlist files are placed on instrumentation server 1699. Once the eventlist files for a given model are placed on instrumentation server 1699, instrumentation server 1699 begins controlling instrumentation events and gathering instrumentation event data for the given model. Placing the eventlist files on instrumentation server 1699 will be referred to hereinafter as "commissioning" a model.

The process continues as depicted at step 1623, with a determination of whether all the desired testing for the given model has been completed. If, as illustrated at step 1625, not all testing for the given model is complete, a new testcase is generated by the testcase generators. Subsequent to generation of a new testcase, a batch controller dispatches the resultant simulation job to a simulation client for execution as shown at step 1626. The simulation job is then executed on the simulation client as depicted at step 1627. Finally, the process returns to step 1623 to repeat until model testing for the given model is complete and the model is removed from the batch simulation farm as illustrated at step 1624.

Those skilled in the art will recognize that it is possible for several concurrent simulation jobs for the same model to be executing contemporaneously within batch simulation farm 1601. That is to say, steps 1625-1627 may be executed with respect to the same model a number of times concurrently by batch controllers within batch simulation farm 1601. The given simulation model is not removed from batch simulation farm 1601 until all outstanding jobs, potentially executing concurrently, for the given simulation model have completed execution. Referring to step 1624, when all testing for the model has been completed, the model is removed from the model servers and therefore from batch simulation farm 1601.

It is often necessary to access particular elements of the instrumentation data for a particular model even after the model has been removed from batch simulation farm 1601. Process step 1628 depicts a determination of whether there still exists a need for access to the instrumentation data stored within instrumentation server 1699 for the given model. In response to a determination that all necessary access to instrumentation data for the model has been completed, the process continues as shown at step 1629, with the eventlist files, control information, and instrumentation data files for the given model all being removed from instrumentation server 1699, thereby removing the model in its entirety from instrumentation server 1699.

Figure 8C:
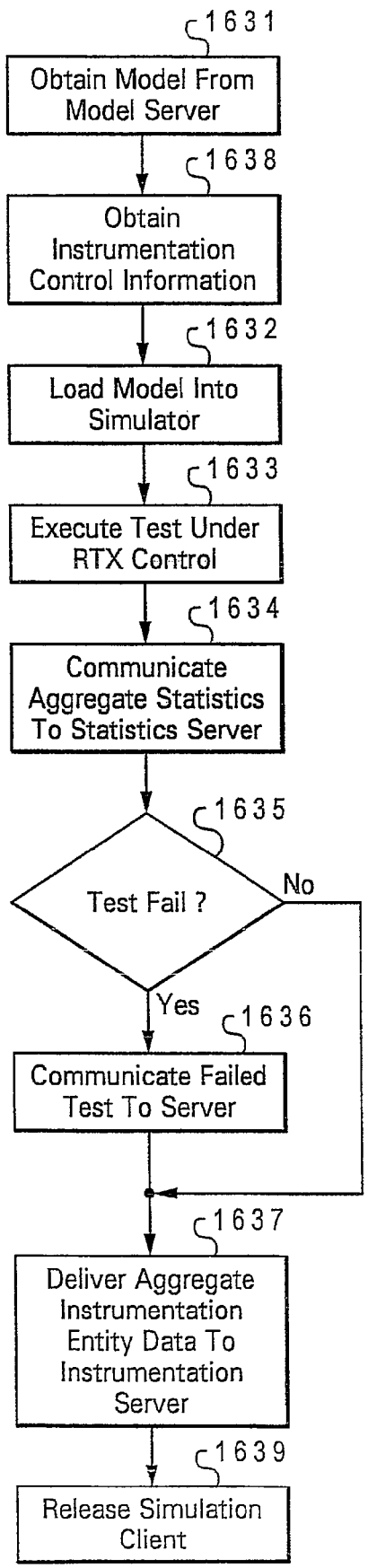
FIG. 8C is a flow diagram depicting steps performed during execution of a simulation job within a batch simulation farm in accordance with a preferred embodiment of the present invention.

With reference to the flowchart of FIG. 8C, the steps involved in simulation job execution step 1627 of FIG. 8B are depicted in greater detail. The process of executing a simulation job on a simulation client begins with step 1631, which depicts the simulation client obtaining a copy of the model corresponding to the given simulation job provided by the model servers. As illustrated at step 1638, the simulation client communicates with instrumentation server 1699 to obtain and process control information for the instrumentation events within the simulation model. Proceeding to step 1632, the simulation model is loaded into a hardware simulator or memory 44 of the simulation client.

The process then moves to step 1633, which depicts the execution of the simulation test under RTX control. Once the simulation test is complete, and as illustrated at step 1634, RTX delivers the aggregate statistical results data obtained from the simulation job to the statistics server wherein the data are logged. Next, as depicted at step 1635, a determination is made of whether or not the testcase failed. If the testcase has failed, and as shown at step 1636, the RTX communicates the failed testcase to the failed testcase servers. If it is determined at step 1635 that the testcase did not fail, the process continues at step 1637, which depicts RTX delivering various aggregate instrumentation event data to the instrumentation server 1699 as will be described below. The process concludes with step 1639, illustrating the simulation client being released to perform other simulation jobs.

Figure 9A:
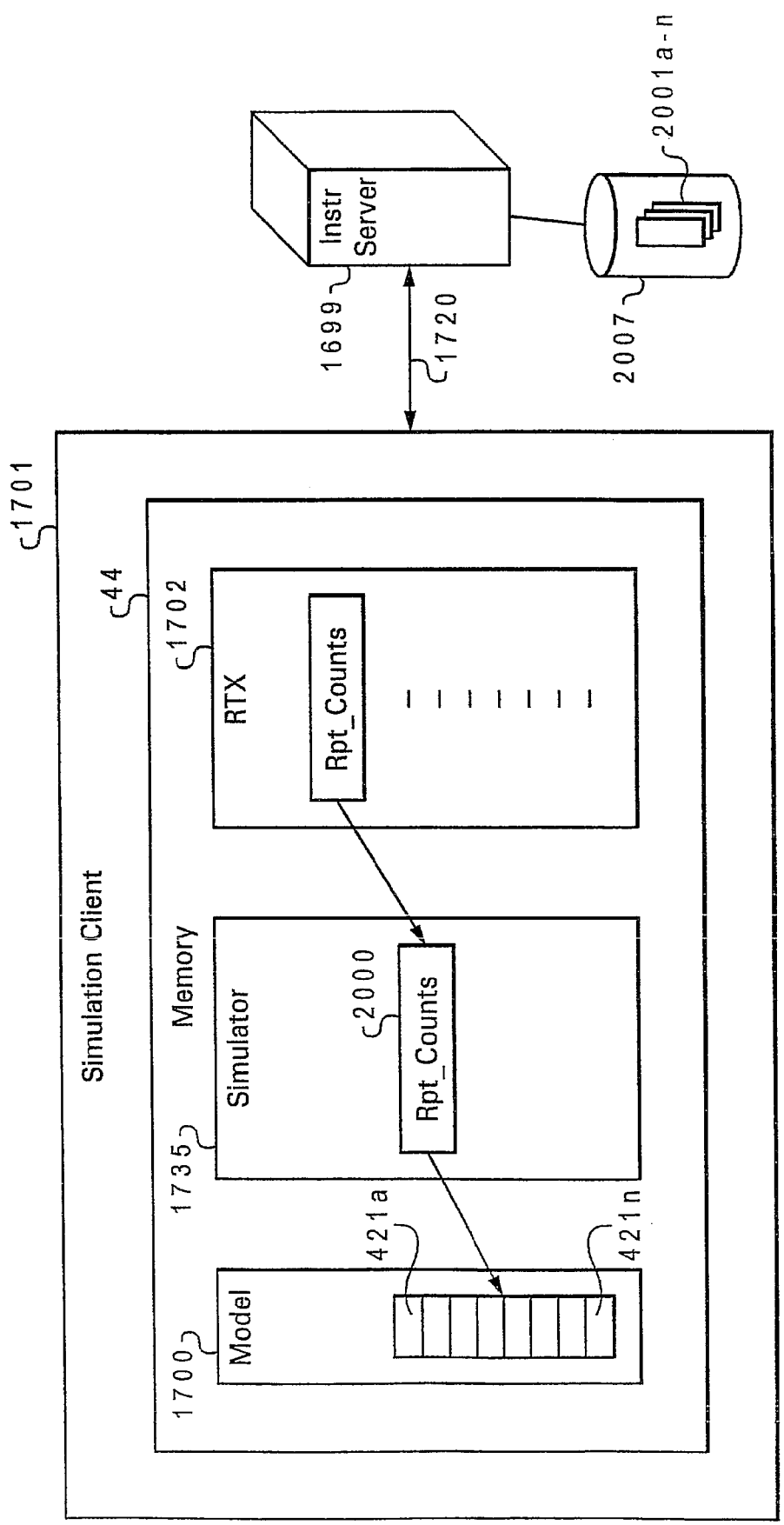
FIG. 9A is a block diagram illustrating the active memory content of a simulation client during simulation model testing in which count event data delivered to an instrumentation server within a batch simulation farm environment in accordance with a preferred embodiment of the present invention.

With reference to FIG. 9A, there is depicted the contents of memory 44 at the conclusion of a simulation processing job performed with respect to simulation model 1700 within simulation client 1701. Simulation model 1700 contains count event registers 421*a*-421*n* as described hereinbefore with reference to FIG. 4B. Each of count event registers 421*a*-421*n* maintains a count representing the number of times a particular instrumentation count event has occurred during the simulation of simulation model 1700.

As part of step 1637 of FIG. 8C, RTX 1702 calls an API entry point rpt_counts( ) 2000. API entry point 2000 generates and delivers an aggregate data packet containing the results registered in count event registers 421*a*-421*n* to instrumentation server 1699 via network 1720. Upon receipt of the aggregate count event data packet, instrumentation server 1699 confirms that the packet information corresponds to a commissioned simulation model utilizing a CRC digital signature. If the aggregate data packet corresponds to a commissioned model, instrumentation server 1699 stores the count data within the aggregate count event packet in a set of count data storage files 2001*a*-2001*n*.

Figure 9B:
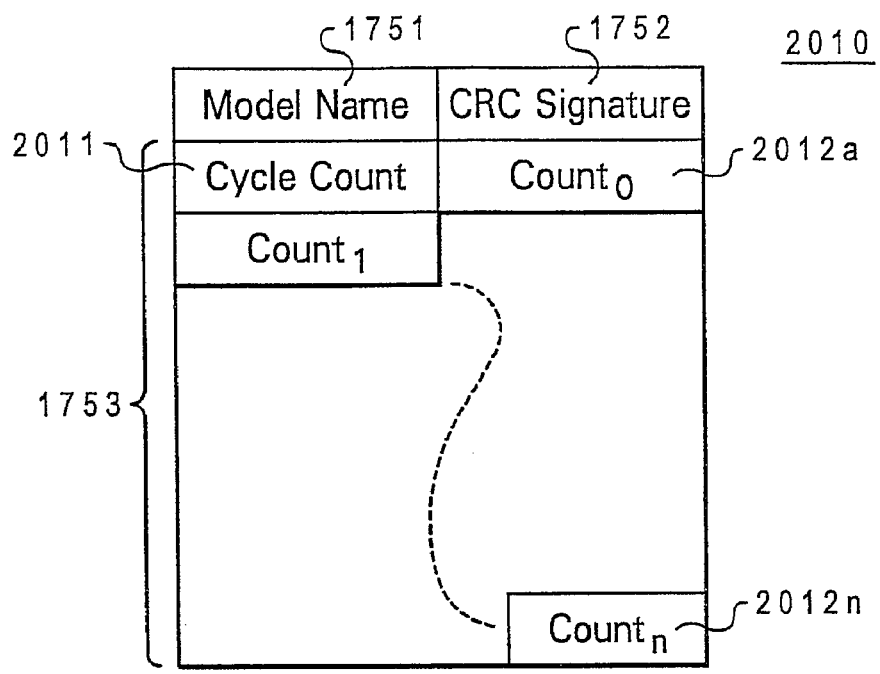
FIG. 9B depicts an aggregate count event packet delivered by an API entry point routine to an instrumentation server in accordance with a preferred embodiment of the present invention.

FIG. 9B depicts an exemplary aggregate count event packet 2010 in accordance with a preferred embodiment of the present invention. Aggregate count event packet 2010, includes model name field 1751, CRC digital signature field 1752, and data field 1753. Within data field 1753, a cycle count field 2011 contains a count value representing the number of cycles executed during the simulation run from which aggregate count event packet 2010 was generated. A set of count value fields 2012*a*-2012*n* contain the count values for each of the count events instantiated within simulation model 1700 in the order set forth by the count eventlist file created at model build time.

Within instrumentation server 1699 depicted in FIG. 9A, the count event data contained in the count value fields for one or more aggregate count event packets is stored in count data storage files 2001*a*-2001*n*. Each of count data storage files 2001*a*-2001*n* therefore contains all recorded counts for a given predetermined time interval (typically a day) for a specified simulation model. When instrumentation server 1699 receives and confirms the commissioned status of aggregate count event packet 2010, one of count data storage files 2001*a*-2001*n* is either created or updated as necessary to store the contents of the received aggregate count event packet 2010.

Figure 9C:
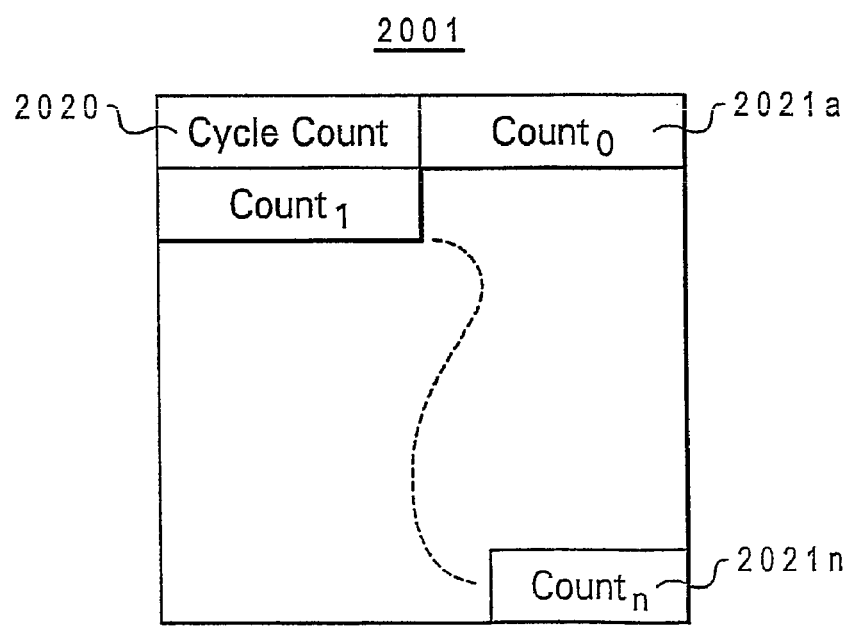
FIG. 9C illustrates a count storage file maintained within a batch simulation farm instrumentation server in accordance with a preferred embodiment of the present invention.

Referring to FIG. 9C there is illustrated the contents of an exemplary count data storage file 2001 among count data storage files 2001*a*-2001*n*. Within count data storage file 2001, a cumulative cycle count field 2020 represents the cumulative number of cycles simulated during every simulation run for which count data is added into count data storage file 2001 over the aforementioned predetermined time interval. A set of cumulative count fields 2021*a*-2021*n* contain the cumulative number of occurrences of each corresponding count event included within count value fields 2012*a*-2012*n* for each aggregate count event packet received by instrumentation server 1699. In summary, when aggregate count event packet 2010 is received and verified by instrumentation server 1699, cycle count field 2011 is added to cumulative cycle count field 2020 and likewise, count value fields 2012a-2012n are added to corresponding cumulative count value fields 2021a-2021n. Count data storage file 2001 therefore contains a cumulative total of the number of cycles executed on the given simulation model and the number of times each count event has occurred over a pre-designated time interval which in the depicted embodiment is a day.

Figure 9D:
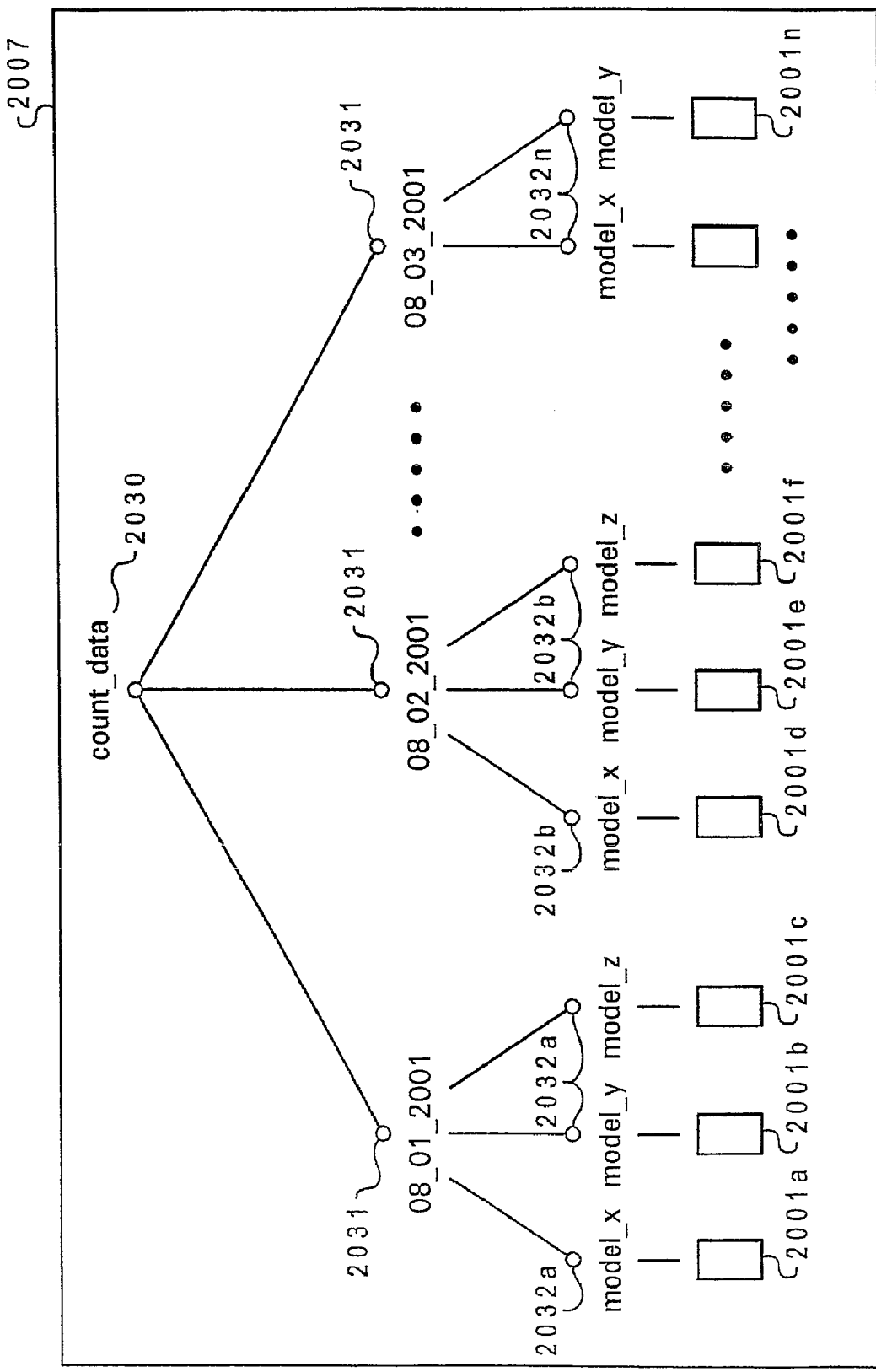
FIG. 9D depicts a counter directory/subdirectory structure maintained within a batch simulation farm instrumentation server in accordance with a preferred embodiment of the present invention.

FIG. 9D illustrates a directory structure implemented within instrumentation server 1699 for storing count data storage files 2001a-2001n. All count data is stored under a counter storage directory 2030 on a disk storage unit 2007 within instrumentation server 1699. As depicted in FIG. 9D, counter storage directory 2030 is further divided into a two-tier subdirectory structure.

A first tier of subdirectories 2031 is utilized to associate count data contained within a received aggregate count event packet with a particular time period (e.g. a specific date) in accordance with a pre-designated time increment. In the embodiment depicted in FIG. 9D, this pre-designated time increment is a day (i.e., one 24-hour period). Each of subdirectories 2031 therefore contains the count data for all simulation models received on a particular date. Each of subdirectories 2031 is named in a fixed manner that is derived from the date on which the subdirectory was created. In association with each of subdirectories 2031, a second tier of subdirectories 2032 is utilized to divide the count data received by instrumentation server 1699 on a given day into directories indexed on a per-model basis. Therefore, each of subdirectories 2032 includes all count data collected for a particular simulation model on a particular date. As shown in FIG. 9D, each of subdirectories 2032 is named in a fixed manner that is derived from the model name of the given model.

As further illustrated in FIG. 9D, each of subdirectories 2032 contains a corresponding one of count data storage files 2001a-2001n, containing the count data for a specified simulation model collected on a given date. The directory/subdirectory structure contained within disk storage unit 2007 provides an efficient directory path for locating count event data for any given simulation model generated on a particular date. For example, sorting count data first by day and then by simulation model, simplifies removal of stale data from instrumentation server 1699. Data for all active simulations models that is obtained during an expired past time interval can be removed simply by removing the appropriate subdirectory 2031 and its contents.

As described in above-referenced U.S. Pat. No. 7,203,633 B2, it often advantageous and necessary to record and access simulation result data based upon the value of factors external to a simulation model itself. These external factors may include, for example, RTX parameters that control the simulation model (e.g., processor/interconnect clock frequency ratio) or characteristics of the testcases run against the simulation model (e.g., testcase strategy). In order to allow this conditional storage and retrieval of data, the above-mentioned patent outlines a method of assigning keyword/value pairs denoting the external factors and their values with the simulation counter data that is returned to an instrumentation server. The instrumentation server creates a so called "keyword table" that contains the received values sets for the keyword/value pairs and also creates a set of count event data files that correspond to each unique value set for the keyword/value pairs.

Figure 10A:
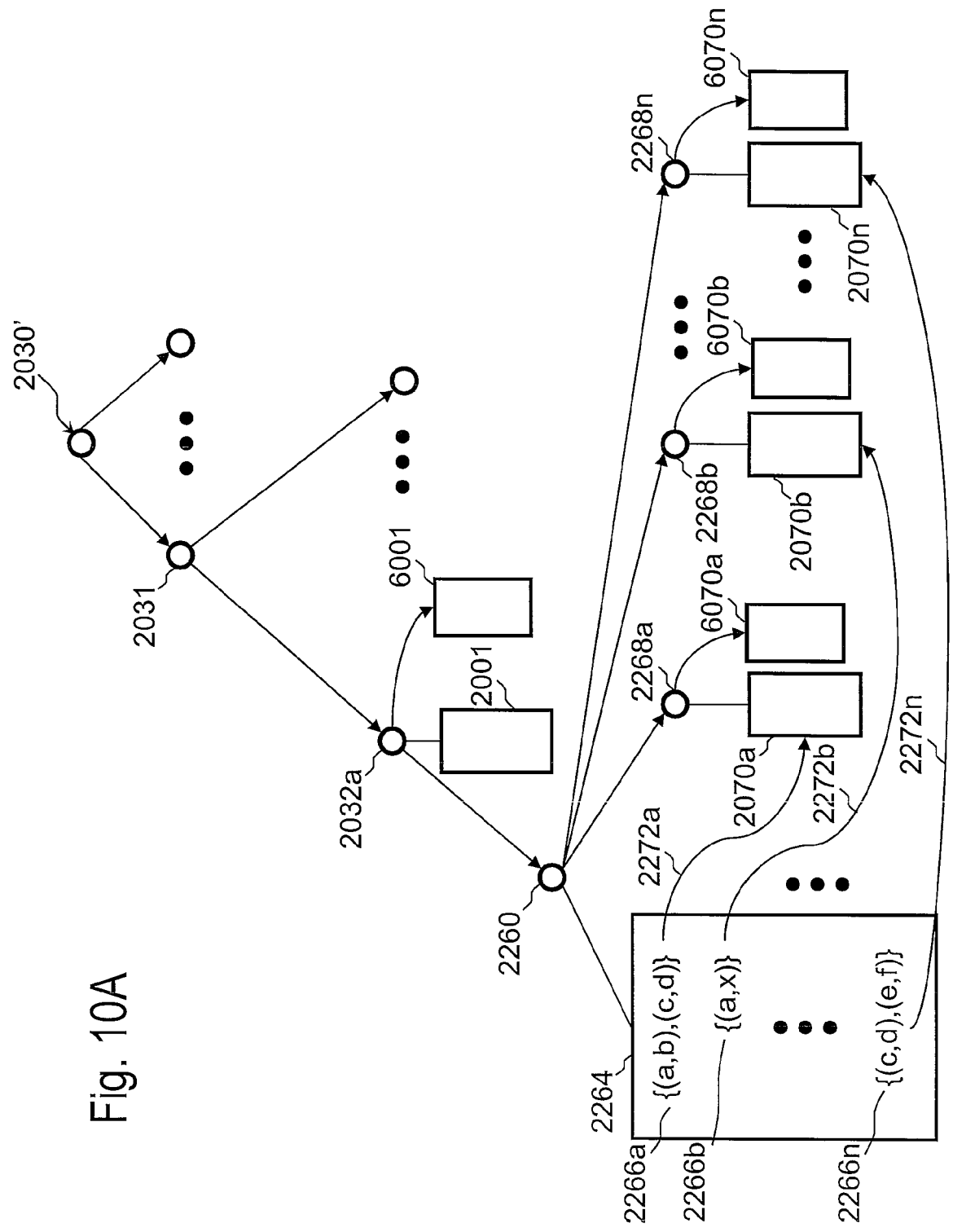
FIG. 10A illustrates a representation of an exemplary counter storage directory 2030' containing data structures necessary to store and retrieve simulation instrumentation data by keyword/value pair sets.

With reference now to FIG. 10A, there is shown a representation of an exemplary counter storage directory 2030' containing data structures necessary to store and retrieve simulation instrumentation data by keyword/value pair sets. As described above, directories 2031 contain count data associated with a particular time interval (e.g., a specific date) in accordance with a pre-designated time increment. Within each directory 2031, a next tier of subdirectories 2032 contain data for a given model on the given day. Count file 2001 within subdirectory 2032 contains count data for the given model for all keyword/value pair sets for the specific time interval. Each directory 2031 also contains a directory 2260 which includes keyword table 2264 and further subdirectories 2268a-2268n. Within subdirectory 2268a-2268n a corresponding count file 2270 contains counter data corresponding to the keyword/value pair sets denoted by row 2266 within keyword value table 2264.

It can be the case in a large batch simulation farm, especially when running short testcases, that the number of aggregate count event packets 2010 received at the instrumentation server can overwhelm the instrumentation server's capacity. In such situations, it would be advantageous to be able to limit the number of aggregate count event packets 2010 that are sent to the instrumentation server. To this end, the present invention preferably enables specification of a "threshold value" for each counter in a model that, once reached, implies that aggregate count event packets 2010 for that counter are no longer to be sent to the instrumentation server. In a given simulation run, if the set of counters with non-zero values are ones that have already reached their threshold value, the simulation client need not transmit aggregate count event packet 2010.

The threshold value is preferably operative over the predetermined time interval associated with subdirectories 2031 of counter storage directory 2030. In other words, at the beginning of the time interval, aggregate count event packets 2010 are transmitted from the simulation clients until collected counter data within the interval indicates that the threshold values have been reached. At the beginning of the next time interval, the threshold values are reset and aggregate count event packets 2010 are again transmitted. If the threshold were applied over the entire life of a given model, it would be possible for count data for a given counter to not be collected for an arbitrary period of time. If, in this period of time, the simulation process was not exercising the given counter, the data collection mechanism would provide no such indication to the user. It is generally undesirable to mask the failure of the simulation process to exercise a given counter for an arbitrarily long period and therefore the ability to transmit aggregate count event packets 2010 is preferably refreshed at the beginning of each time interval.

The threshold value for a given counter within a model may be specified in a number of ways. The first of these ways is a default threshold value that is applied to all the counters in a model in the absence of other qualifications. A second way is a specific per-counter threshold value. These per-counter threshold values can be specified for the model as a whole ignoring keyword/values pair sets (i.e., a set of threshold values for the counts stored in count data file 2001) or specified for a specific keyword/value pair set (i.e., a set of threshold values for the counter values stored in count data files 2270a-2270n). Count threshold file 6001 is a file containing a linear array representing the threshold values for counters contained in count data file 2001. Similarly, count threshold files 6070a-6070n represent the count threshold values for count data files 2270a-2270n, respectively. Whenever a new directory 2032 or 2268 is created, if no preexisting count threshold file is in place, a default count threshold limit file is created containing count threshold values of zero. A zero value is used to indicate that no limit is placed on the number of counts to be collected for the given counter.

With reference again to FIG. 8A, to allow simulation clients to determine whether to communicate the counter values for the current testcase, instrumentation server 1699 (FIG. 8A) maintains a current copy of count threshold files (e.g., 6001, 6070a-6070n) and count data files (e.g., 2001, 2070a-2070n) for the currently active time interval at a fixed known place in the shared file system present on disks 1604 (FIG. 8A). A simulation client may, at the conclusion of a testcase, refer to these count data and count threshold files to determine if the current testcase exercised any counters that have not already reached their threshold values within the current time interval. If so, the counter data is transmitted to instrumentation server 1699. If not, the counter data is not transmitted to instrumentation server 1699, relieving the load placed on instrumentation server 1699.

To maintain the current copy of the count data and count threshold files in the shared file system on disks 1604, the instrumentation server preferably copies, at a predetermined interval referred to as the "file system interval" that is shorter than the time interval associated with count data subdirectory 2031 (FIG. 10A), the current values of the count threshold files (6001, 6070a-6070n) and count data files (2001, 2070a-2070n). A typical file system interval is on the order of 15-30 minutes though it may be a shorter or longer time interval.

Figure 10B:
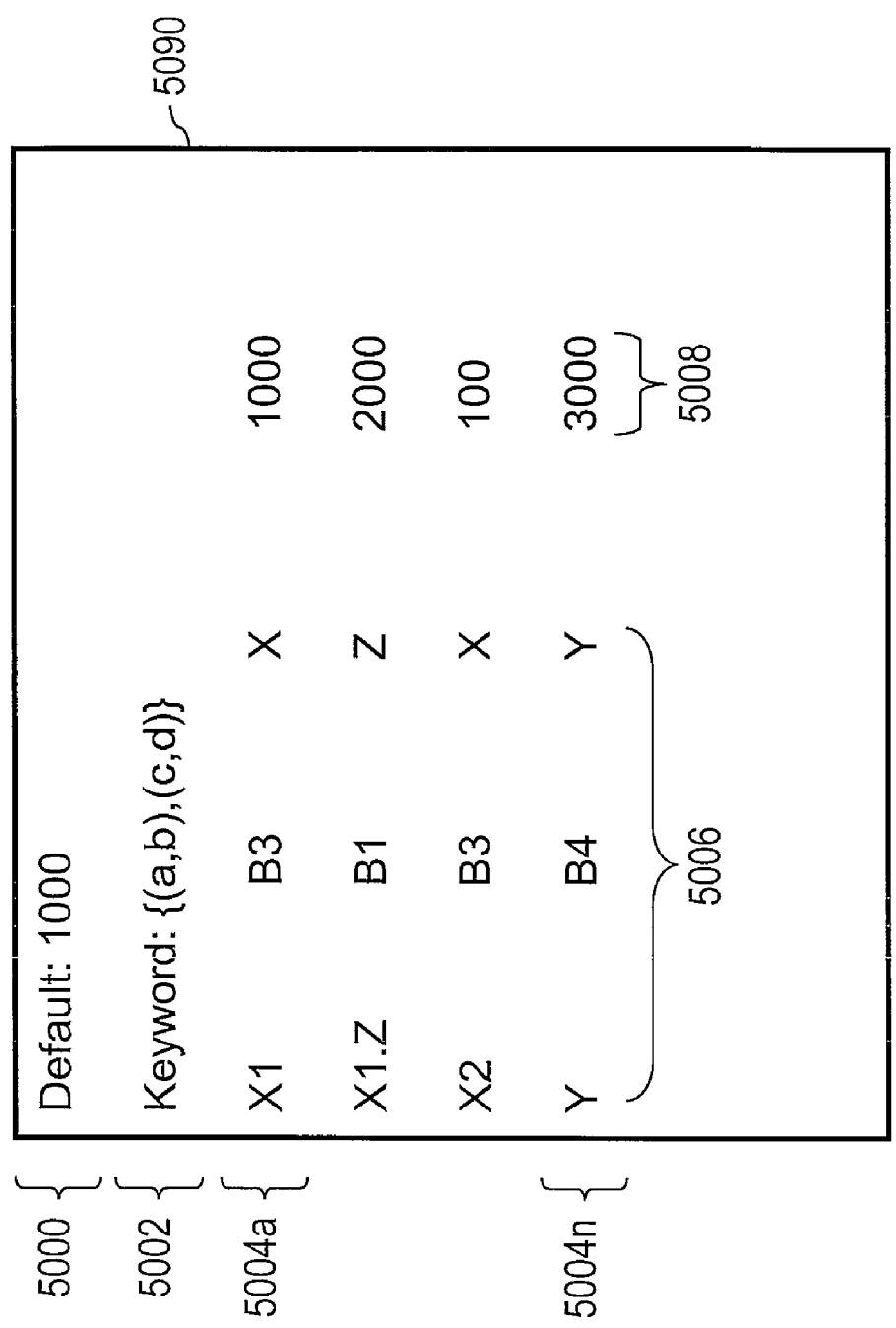
FIG. 10B depicts an exemplary embodiment of a count threshold specification file 5090.

Further, instrumentation server 1699 preferably enables the setting of default threshold values and per counter test values. With reference now to FIG. 10B, an exemplary embodiment of a count threshold specification file 5090 is illustrated. Count threshold specification file 5090 includes an optional default declaration 5000, which specifies a default threshold value for the counters not specified in specific counter threshold declarations 5004a-5004n for the counters in the model. Further, optional keyword/value pair set declaration 5002 specifies the keyword/value pair set to which count threshold specification file 5090 applies (in this case count data file 2270 of FIG. 10A). If no keyword/value pair set declaration is specified, the count threshold specification file 5090 is associated with the count data file for the overall model (e.g., count data file 2001). Specific counter threshold declarations 5002 contain an event declaration 5006 according to the format of FIG. 5B or FIG. 5D and a count threshold value 5008. To update the threshold data files, a user creates a threshold specification file 5090. An application program (not illustrated) executing on a general purpose computer 1600 takes as input a model name and threshold specification file 5090 and communicates this information to instrumentation server 1699, which alters count threshold file 6001 or 6070a-6070n as appropriate.

Figure 10C:
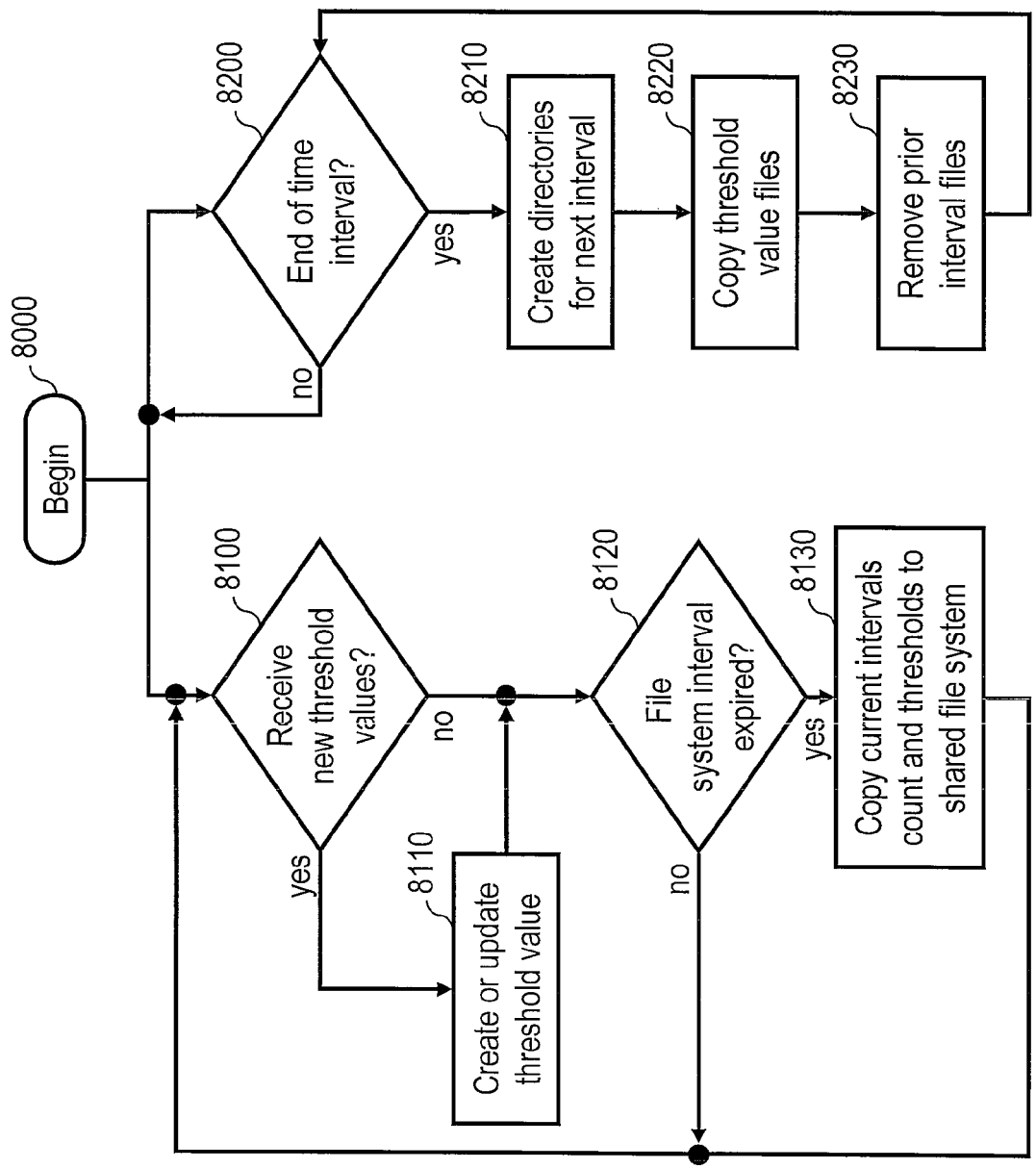
FIG. 10C is a high level logical flowchart of an exemplary process by which an instrumentation server maintains a current copy of count data and count threshold files in a shared file system and within the instrumentation server.

With reference now to FIG. 10C there is illustrated a high level logical flowchart of an exemplary process by which instrumentation server 1699 maintains the current copy of count data and count threshold files in the shared file system and within the server. The process begins at step 8000 and then splits into separate concurrent processes denoted by reference numerals 8100-8130 and 8200-8230.

At block 8100, instrumentation server 1699 determines if a request to update the threshold values for a given model or model and value/keyword pair set has been received. If so, the process then proceeds to block 8110, which depicts instrumentation server 1699 parsing the received threshold specification file 5090 and either updating an existing count threshold file in accordance with the request or creating, as necessary, the appropriate subdirectories and count threshold files within count data subdirectory 2030'. The process then proceeds to block 8120.

If a determination is made at block 8100 that no request to update the threshold values for a model has received at block 8100, the process then proceeds to block 8120. Block 8120 illustrates instrumentation server 1699 determining if the file system interval has expired. If not, the process returns to block 8100, which has been described. If a determination is made at block 8120 that the file system interval has expired, the process proceeds to block 8130, which depicts instrumentation server 1699 copying the current set of count data and count threshold files from instrumentation server 1699 to the known fixed location within the shared file system residing on disks 1604 (FIG. 8A). This update will cause future testcases to be influenced by the current accumulated count and count threshold values. Following block 8130, the process then returns to block 8100, which has been described.

Returning now to block 8200, instrumentation server 1699 determines if the time interval associated with count data storage subdirectories 2031 (typically a day) has expired. If not, the process iterates at block 8200. If so, the process moves to block 8210. At block 8210, instrumentation server 1699 creates, on instrumentation server 1699, the necessary subdirectories 2032, 2260, and 2268a-2268n for the next time interval to hold the currently active count threshold data files 6001 and 6070a-6070n. The process then moves to step 8220. At block 8220, the count threshold files 6001 and 6070a-6070n for the prior time interval are copied into the directories for the current time interval created at block 8210. Next, at block 8230 instrumentation server 1699 removes the copy of the prior interval's count data and count threshold files from the shared file system stored on disks 1604 (this data is no longer in use as the prior interval has completed).

Figure 10D:
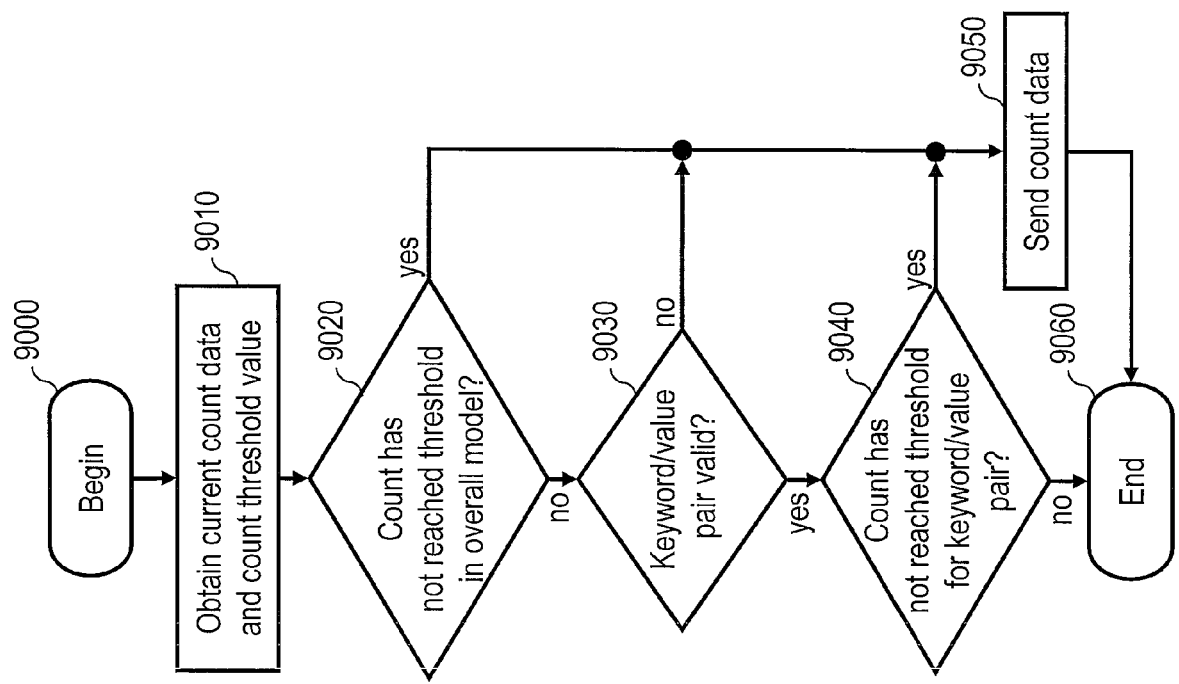
FIG. 10D is a high level logical flowchart of an exemplary process by which a simulation client communicates counter data to an instrumentation server subject to a threshold.

With reference now to FIG. 10D, there is illustrated a high level logical flowchart of an exemplary embodiment of the process performed by a simulation client at block 1637 of FIG. 8C when the simulation client is communicating counter data to instrumentation server 1699. The process begins at block 9000 and then proceeds to block 9010. At block 9010, the simulation client obtains a copy of the current counter data and counter threshold data from the shared file system image maintained by instrumentation server 1699. The simulation client obtains these files by referencing the known location of the shared file system copy of simulation count data directory 2030', the name of the model and any active keyword data for the current simulation run. If the current simulation run has active keywords, the simulation client must obtain a count data threshold file 6070 in addition to the count threshold file 6001 for the current model. If either or both of these files do not exist in the shared file system copy of simulation count data directory 2030', the simulation client assumes zero values (e.g., no threshold as described above) for the thresholds for all counters for the file that is not present.

The process then proceeds to block 9020, which illustrates the simulation client determining if any counters exercised within the current testcase run have not achieved their threshold limits for the overall model disregarding keywords. The simulation client determines whether any counters have not achieved their threshold limits by consulting the overall model count data file 2001 and threshold limit values file 6001 obtained from the shared file system and comparing that to the current values of the counters for the given testcase. If not, the process proceeds to block 9030, which is described below. If the current testcase has exercised counters that have not reached their threshold values, the process proceeds to step 9050. Block 9050 depicts the simulation client transmitting the counter data obtained by the testcase run to instrumentation server 1699 for recording in data directory 2030'. The process then terminates at block 9060.

Referring now to block 9030, the simulation client determines if the keyword/value pair set (if present) is valid. If no keywords are specified, the keyword/value set is presumed to be valid. If a keyword/value set is active in the current testcase, it is considered valid if a corresponding directory 2268 exists with both a count threshold file 6070 and a count data file 2270. If either file does not exist or the subdirectory does not exist, the keyword pair is considered not valid, and the process proceeds to block 9050, which has been previously described. Otherwise, the process moves to block 9040, which illustrates the simulation client determining if any counter(s) exercised within the current testcase run have not achieved their threshold limits for the current keyword/value pair set. The simulation client makes this determination by consulting the count data file 2270 and the threshold limit values file 6070 obtained from the shared file system and comparing that to the current values of the counters for the given testcase. If all counters within the current testcase have achieved their threshold limits for the current keyword/value pair, the process terminates at block 9060 without reporting any further count data to instrumentation server 1699. In this manner, instrumentation server 1699 is not overburdened by count data that is deemed to be unnecessary to exercise the simulation model. If, on the other hand, simulation client determines at block 9040 that the current test case has exercised counters that have not reached their threshold values for the keyword/value pair, the process then proceeds to block 9050, which has previously been described.

As has been described, in at least some embodiments, a design is simulated utilizing a hardware description language (HDL) simulation model by stimulating the HDL simulation model with a testcase. During simulation, occurrences of a count event are counted in a count event counter to obtain a count event value. After completion of the testcase, a determination is made if addition of the count event value to the aggregate count event value for the count event counter would cause the aggregate count event value to exceed a threshold. If not, the count event value is recorded in a testcase data storage area, and the count event value is accumulated in the aggregate count event value. If so, the count event value is discarded without recording the count event value in the testcase data storage area.

While the invention has been particularly shown as described with reference to exemplary embodiment(s), it will be understood by those skilled in the art that various changes in form and detail may be made therein without departing from the spirit and scope of the invention. For example, one of the embodiments of the invention can be implemented as sets of instructions resident in random access memory 28 of one or more computer systems configured generally as described in FIG. 1 and FIG. 2. Until required by computer system 10, the set of instructions may be stored in another computer readable storage device, such as disk drive 33 or in a removable storage device such as an optical disk for eventual use in a CD-ROM drive or a floppy disk for eventual use in a floppy disk drive. The set of instructions may be referred to as a computer program product. Further, the set of instructions can be stored in the memory of another computer and transmitted over a local area network or a wide area network, such as the Internet, when desired by the user.

What is claimed is:

1. A method of simulation processing in a data processing system, said method comprising:
at a simulation client, simulating a design utilizing a hardware description language (HDL) simulation model by stimulating the HDL simulation model with a plurality of testcases, wherein the HDL simulation model includes instrumentation not forming a portion of the design that includes a count event counter for a count event in the design, and wherein the simulating includes counting occurrences of said count event in said count event counter to obtain a respective count event value for each of the plurality of testcases; and
establishing a threshold greater than 1 for an aggregate count event value of said count event counter over the plurality of testcases and associating the threshold with the HDL simulation model, wherein the aggregate count event value aggregates count event values for the count event over the plurality of testcases;
after completion of each completed testcase among the plurality of testcases:
determining if addition of the count event value of the completed testcase to the aggregate count event value for the count event counter would cause the aggregate count event value over the plurality of testcases to exceed the threshold;
in response to a determination that the addition of the count event value of the completed testcase to the aggregate count event value would not cause the aggregate count event value to exceed the threshold, recording the count event value of the completed testcase in a testcase data storage area and accumulating the count event value of the completed testcase in the aggregate count event value; and
in response to a determination that the addition of the count event value to the aggregate count event value would cause the aggregate count event value to exceed the threshold, discarding the count event value of the completed testcase without recording the count event value of the completed testcase in the testcase data storage area.

2. The method of claim 1, wherein:
said count event counter comprises a first count event counter;
said threshold comprises a first threshold;
said method further comprises establishing a second threshold greater than 1 for a second count event counter in the instrumentation of the HDL simulation model; and
said discarding comprises discarding a count event value of the second count event counter and the count event value of the first count event counter if the count event value of the first count event counter exceeds said first threshold and the count event value of the second count event counter exceeds said second threshold.

3. The method of claim 1, and further comprising resetting the aggregate count event value at regular intervals.

4. The method of claim 1, wherein said determining comprises performing said determining using a keyword/value pair specified for the plurality of testcases, wherein the keyword identifies the count event counter and the value identifies the threshold.

5. The method of claim 1, wherein said recording comprises transmitting the count event value from the simulation client to a simulation server that aggregates count data for multiple testcases.

6. The method of claim 1, wherein said recording comprises recording the count event value in a file system directory structure in association with a file indicating the threshold applicable to the plurality of testcases.

7. A data processing system, comprising:
a processor; and
data storage coupled to the processor; and simulation program code within the data storage and executable by the processor to simulate a design utilizing a hardware description language (HDL) simulation model by stimulating the HDL simulation model with a plurality of testcases, wherein the HDL simulation model includes instrumentation not forming a portion of the design that includes a count event counter for a count event in the design, and wherein the simulating includes counting occurrences of said count event in said count event counter to obtain a respective count event value for each of the plurality of testcases, wherein after completion of each completed testcase among the plurality of testcases, the simulation program code determines if addition of the count event value of the completed testcase to an aggregate count event value for the count event counter would cause the aggregate count event value over the plurality of testcases to exceed a threshold associated with the HDL simulation model, and wherein responsive to a determination that the addition of the count event value of the completed testcase to the aggregate count event value would not cause the aggregate count event value to exceed the threshold, the simulation program code records the count event value of the completed testcase in a testcase data storage area and accumulates the count event value of the completed testcase in the aggregate count event value, and responsive to a determination that the addition of the count event value to the aggregate count event value would cause the aggregate count event value to exceed the threshold, discards the count event value of the completed testcase without recording the count event value of the completed testcase in the testcase data storage area.

8. The data processing system of claim 7, wherein:
said count event counter comprises a first count event counter;
said threshold comprises a first threshold;
the simulation program code discards a count event value of a second count event counter and the count event value of the first count event counter if the count event value of the first count event counter exceeds said first threshold and the count event value of the second count event counter exceeds a second threshold.

9. The data processing system of claim 7, wherein the simulation program code resets the aggregate count event value at regular intervals.

10. The data processing system of claim 7, wherein said simulation program code further comprises code for performing said determining using a keyword/value pair specified for the plurality of testcases, wherein the keyword identifies the count event counter and the value identifies the threshold.

11. The data processing system of claim 7, wherein said simulation program code records the count event value by transmitting the count event value from the data processing system to a simulation server that aggregates count data for multiple testcases.

12. The data processing system of claim 7, wherein said simulation program code records the count event value in a file system directory structure in association with a file indicating the threshold applicable to the plurality of testcases.

13. A program product, comprising:
a computer readable storage medium; and
simulation program code within the computer readable data storage medium and executable by a processor to simulate a design utilizing a hardware description language (HDL) simulation model by stimulating the HDL simulation model with a plurality of testcases, wherein the HDL simulation model includes instrumentation not forming a portion of the design that includes a count event counter for a count event in the design, and wherein the simulating includes counting occurrences of said count event in said count event counter to obtain a respective count event value for each of the plurality of testcases, wherein after completion of each completed testcase among the plurality of testcases, the simulation program code determines if addition of the count event value of the completed testcase to an aggregate count event value for the count event counter would cause the aggregate count event value over the plurality of testcases to exceed a threshold associated with the HDL simulation model, and wherein responsive to a determination that the addition of the count event value of the completed testcase to the aggregate count event value would not cause the aggregate count event value to exceed the threshold, the simulation program code records the count event value of the completed testcase in a testcase data storage area and accumulates the count event value of the completed testcase in the aggregate count event value, and responsive to a determination that the addition of the count event value to the aggregate count event value would cause the aggregate count event value to exceed the threshold, discards the count event value of the completed testcase without recording the count event value of the completed testcase in the testcase data storage area.

14. The program product of claim 13, wherein:
said count event counter comprises a first count event counter;
said threshold comprises a first threshold;
the simulation program code discards a count event value of a second count event counter and the count event value of the first count event counter if the count event value of the first count event counter exceeds said first threshold and the count event value of the second count event counter exceeds a second threshold.

15. The program product of claim 13, wherein the simulation program code resets the aggregate count event value at regular intervals.

16. The program product of claim 13, wherein said simulation program code further comprises code for performing said determining using a keyword/value pair specified for the plurality of testcases, wherein the keyword identifies the count event counter and the value identifies the threshold.

17. The program product of claim 13, wherein said simulation program code records the count event value by transmitting the count event value from the data processing system to a simulation server that aggregates count data for multiple testcases.

18. The program product of claim 13, wherein said simulation program code records the count event value in a file system directory structure in association with a file indicating the threshold applicable to the plurality of testcases.

19. A processor, comprising:
at least one processor core;
an interconnect coupled to the processor core and capable of being coupled to data storage; and
the processor core for executing simulation program code stored within the data storage to simulate a design utilizing a hardware description language (HDL) simulation model by stimulating the HDL simulation model with a plurality of testcases, wherein the HDL simulation model includes instrumentation not forming a portion of the design that includes a count event counter for a count event in the design, and wherein the simulating includes counting occurrences of said count event in said count event counter to obtain a respective count event value for each of the plurality of testcases, wherein after completion of each completed testcase among the plurality of testcases, the simulation program code determines if addition of the count event value of the completed testcase to an aggregate count event value for the count event counter would cause the aggregate count event value over the plurality of testcases to exceed a threshold associated with the HDL simulation model, and wherein responsive to a determination that the addition of the count event value of the completed testcase to the aggregate count event value would not cause the aggregate count event value to exceed the threshold, the simulation program code records the count event value of the completed testcase in a testcase data storage area and accumulates the count event value of the completed testcase in the aggregate count event value, and responsive to a determination that the addition of the count event value to the aggregate count event value would cause the aggregate count event value to exceed the threshold, discards the count event value of the completed testcase without recording the count event value of the completed testcase in the testcase data storage area.

* * * * *